(12) United States Patent
Kobayashi

(10) Patent No.: US 7,271,535 B2
(45) Date of Patent: Sep. 18, 2007

(54) ELECTROLUMINESCENT DISPLAY DEVICE, METHOD FOR MANUFACTURING THE SAME, AND ELECTRONIC EQUIPMENT

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 307 days.

(21) Appl. No.: 10/722,448

(22) Filed: Nov. 28, 2003

(65) Prior Publication Data

US 2005/0040759 A1  Feb. 24, 2005

(30) Foreign Application Priority Data

Dec. 5, 2002  (JP) ............... 2002-353672
Oct. 2, 2003  (JP) ............... 2003-344803

(51) Int. Cl.
*H01L 51/00* (2006.01)

(52) U.S. Cl. ...................... 313/504; 313/506

(58) Field of Classification Search ........... 313/504, 313/506, 512
See application file for complete search history.

(56) References Cited

U.S. PATENT DOCUMENTS

| | | | |
|---|---|---|---|
| 5,760,423 A * | 6/1998 | Kamakura et al. ............ | 257/99 |
| 6,322,910 B1 | 11/2001 | Arai et al. | |
| 6,403,987 B1 * | 6/2002 | Miki et al. ................... | 257/99 |
| 7,009,749 B2 * | 3/2006 | Ide et al. ...................... | 359/237 |
| 2002/0043934 A1 | 4/2002 | Tanaka | |
| 2005/0127824 A1 * | 6/2005 | Mori et al. ................... | 313/504 |

FOREIGN PATENT DOCUMENTS

| | | |
|---|---|---|
| JP | A 08-185984 | 7/1996 |
| JP | A 10-289784 | 10/1998 |
| JP | A 2000-40589 | 2/2000 |
| JP | A 2001-176660 | 6/2001 |
| JP | A 2002-198187 | 7/2002 |
| JP | A 2003-142274 | 5/2003 |
| KR | 2002-0030726 A | 4/2002 |

OTHER PUBLICATIONS

Ching-Ting Lee et al., "Effects of Plasma Treatment on the Electrical and Optical Properties of Indium Tin Oxide Films Fabricated by R.F. Reactive Sputtering", Thin Solid Films, vol. 386, 2001, pp. 105-110.

* cited by examiner

*Primary Examiner*—Karabi Guharay
(74) *Attorney, Agent, or Firm*—Oliff & Berridge, PLC

(57) ABSTRACT

A transparent cathode electrode technology for an electroluminescent display device having a top emission structure, provides a top emission type electroluminescent display device and a method to manufacture the same. Oxidation of a substrate film can be reduced or prevented during the film formation of a metal oxide. Electronic equipment including this display device is also provided. A first electrode, a function layer including a luminescent layer, and a transparent second electrode made of a metal oxide are laminated on the substrate in that order from the lower surface. At this time, the oxygen concentration in the second electrode is made to vary in the film thickness direction, and the oxygen concentration in the vicinity of the interface between the second electrode and the function layer is made lower than the average oxygen concentration in the second electrode.

3 Claims, 16 Drawing Sheets

STRIPE

MOSAIC

DELTA

ELECTROLUMINESCENT DISPLAY DEVICE, METHOD FOR MANUFACTURING THE SAME, AND ELECTRONIC EQUIPMENT

BACKGROUND OF THE INVENTION

1. Field of Invention

The present invention relates to an electroluminescent display device, a method to manufacture the same, and electronic equipment provided with this electroluminescent display device.

2. Description of Related Art

Electroluminescent (hereafter referred to as EL) display devices have been developed until now as display device for portable devices, e.g., cellular phones and PDAs, personal computers, and the like.

The EL display device is configured to include a plurality of luminescent elements, which is composed of a pair of electrodes holding an EL layer (electroluminescent layer) therebetween, in a substrate surface, and desired display is performed by independently controlling the driving of each luminescent element. This EL display device can be classified into, for example, a bottom emission type which takes light from the side of the element substrate and a top emission type which takes light from the side of the sealing element, based on the difference in direction from which the light of the luminescent layer comes. However, the bottom emission type structure has been primarily researched until now for reasons of flexibility in selection of materials and the like.

In the field of the display device, needs for upsizing, high definition, and high brightness are intensified, and intensive research on upsizing of the EL display device have been actively pursued as well. However, the upsizing of the above-described bottom emission type EL display device requires a thick wiring to supply signals to electrodes and, thereby, a problem of reduction in aperture ratio of the pixel occurs. When the aperture ratio is reduced as described above, a large current is passed through the luminescent layer in order to ensure the brightness of the pixel and, as a result, a problem of a reduction in the product life occurs as well. Consequently, in recent years, the top emission type structure in which the aperture ratio of the pixel is not affected by the structure of the wiring and the like is noted, and is intensively researched. See Japanese Unexamined Patent Application Publication No. 8-185984.

With respect to a pair of electrodes holding an EL layer there between in such a top emission type EL display device, the electrode in the sealing element side (observer side) must be a transparent electrode. In general, a metal oxide, e.g., ITO and $SnO_2$, is used for such a transparent electrode. This metal oxide is formed by sputtering a metallic material onto a substrate in an atmosphere of a carrier gas having a constant oxygen concentration.

It is known that the light transmittance of the metal oxide varies depending on the oxygen content thereof, and at least a predetermined content of oxygen must be ensured in order to attain adequate transparency.

However, in the formation of the metal oxide by sputtering on the EL layer or an electron injection layer (or a hole injection layer) provided on the EL layer, there is a problem in that the substrate EL layer may be oxidized by active oxygen in the carrier gas and, thereby, the luminescent characteristics are degraded.

SUMMARY OF THE INVENTION

The present invention was made in consideration of the above-described problems. The present invention provides a top emission type electroluminescent display device and a method to manufacture the same, n oxidation of a substrate film being reduced or prevented during the film formation of a metal oxide, and provides electronic equipment including this display device.

In order to achieve the above, the electroluminescent display device according to an aspect of the present invention is composed of a first electrode, a function layer including a luminescent layer, and a transparent second electrode made of a metal oxide, which are laminated on a substrate in that order from the lower surface, the oxygen concentration in the above-described second electrode varying in the film thickness direction, and the oxygen concentration in the vicinity of the interface between the above-described second electrode and the above-described function layer being lower than the average oxygen concentration in the above-described second electrode.

In the present configuration, the average oxygen concentration in the second electrode is controlled to become at least a predetermined concentration in order to attain transparency required for display, and there is a concentration gradient in the film thickness direction. For example, the oxygen concentration in the lower portion (toward the function layer) is lower than the oxygen concentration in the upper layer side, and the oxygen concentration in the vicinity of the interface with the function layer is lower than the above-described predetermined concentration. Consequently, when the above-described metal oxide film is deposited by sputtering in the vicinity of the interface with the function layer, the partial pressure of oxygen in the carrier gas can be lowered more than in prior arts and, therefore, oxidation of the function layer serving as a substrate can be minimized during the film formation. In this manner, reduction in luminous efficacy of the function layer can be reduced or prevented, and bright display can be realized. In particular, desirably, the oxygen concentration in the vicinity of the interface with the function layer is substantially zero and, thereby, damage to the function layer due to oxidation during the film formation can be minimized.

The function layer is configured as, for example, a laminate of a luminescent layer, an electron transportation/injection layer and a hole transportation/injection layer to transport/inject electrons and holes into this luminescent layer, and the like. Alternatively, the function layer may be composed of only the luminescent layer.

The vicinity of the interface refers to a region within the range of 5 nm from the interface with the function layer in the film thickness direction.

A method to manufacture an electroluminescent display device according to an aspect of the present invention includes the steps of forming a first electrode on a substrate; forming a function layer including a luminescent layer on the above-described first electrode; and sputtering a metallic material on the above-described function layer in an atmosphere of an oxygen-containing carrier gas, so as to form a transparent second electrode made of a metal oxide on the above-described function layer, the partial pressure of oxygen in the above-described carrier gas being increased with increased deposition of the above-described metal oxide deposited on the above-described function layer during the above-described sputtering.

In the present manufacturing method, when the metal oxide film is deposited by sputtering on the function layer, the partial pressure of oxygen in the initial stage of the film formation can be lowered more than in the related art. Therefore, oxidation of the function layer due to active oxygen in the carrier gas can be minimized, and a display device having a high luminous efficacy can be prepared. Since the partial pressure of oxygen in the carrier gas is increased with increased deposition of the metal oxide film, the transparency of the whole second electrode required for display can be attained by increasing the oxygen concentration in the upper layer side in order that the oxygen concentration in second electrode as a whole becomes at least the above-described predetermined concentration.

When the partial pressure of oxygen in the above-described carrier gas is increased during the above-described sputtering, preferably, the partial pressure of oxygen is increased continuously or stepwise. In this manner, a desired average oxygen concentration suitable to attain the transparency required for display can easily be attained.

Since the partial pressure of oxygen in the carrier gas is controlled to be substantially zero when the above-described amount of deposition is less than a predetermined film thickness during the above-described sputtering, oxidation of the function layer can be completely reduced or prevented.

Preferably, the above-described predetermined film thickness is 5 nm or more and 30 nm or less. For example, if supply of oxygen is started when the amount of film formation is less than 5 nm, the function layer to serve as the substrate is oxidized and, therefore, an adequate luminous efficacy cannot be attained. On the other hand, if only the metallic material is formed into a film having a thickness exceeding 30 nm, the second electrode is darkened and, therefore, the display quality is significantly degraded.

Electronic equipment according to an aspect of the present invention is provided with the above-described electroluminescent display device.

According to the present configuration, the electronic equipment including a display portion having a high luminous efficacy can be provided.

DETAILED DESCRIPTION OF PREFERRED EXEMPLARY EMBODIMENTS

First Exemplary Embodiment

The first exemplary embodiment of the present invention will be described below with reference to the figures. In FIG. 1 to FIG. 18, the scale of each layer or each element is differentiated from each other in order that each layer or each element has a size capable of being identified in the figure.

Figure 1:
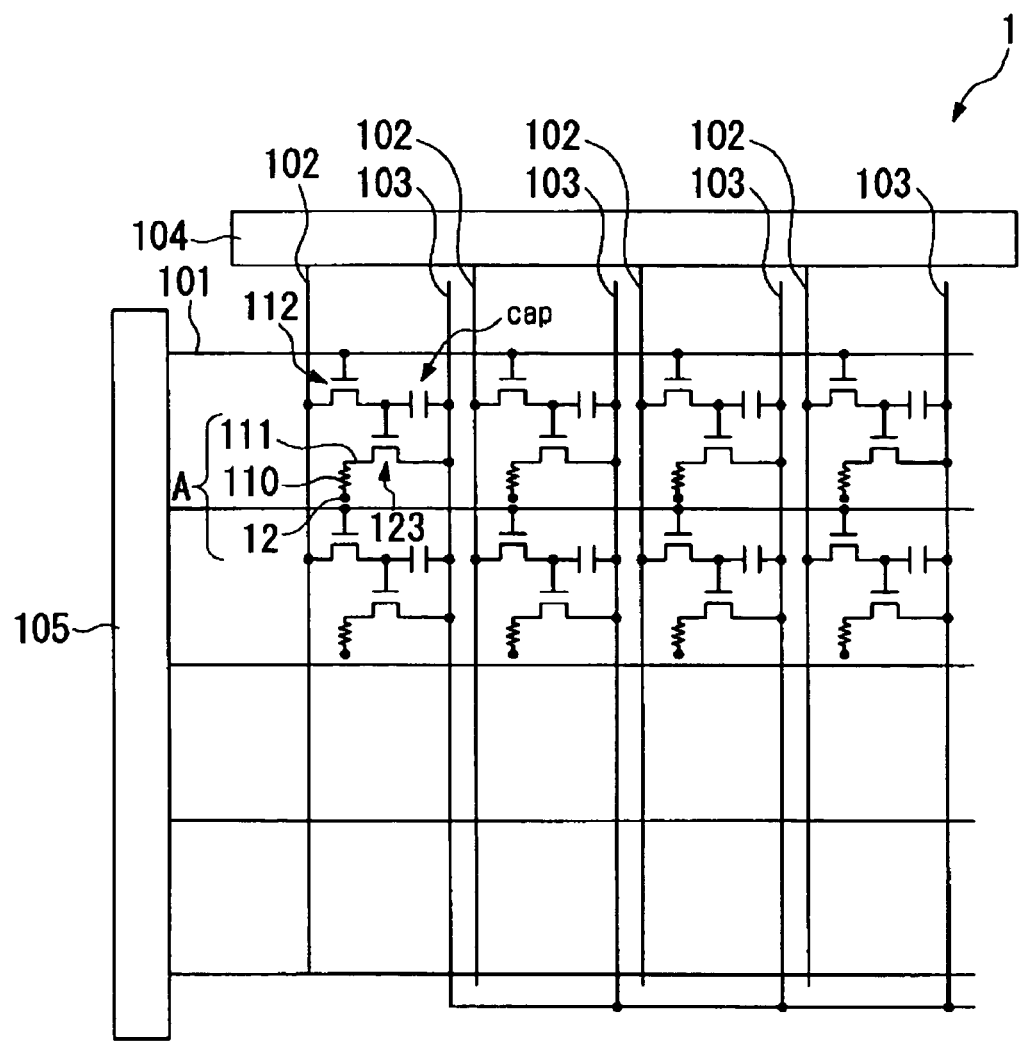
FIG. 1 is a schematic showing the wiring structure of the display device according to the first exemplary embodiment of the present invention.

FIG. 1 is a schematic plan view showing the wiring structure of an organic EL display device as an example of an electroluminescent display device according to the present exemplary embodiment.

As shown in FIG. 1, the electroluminescent display device 1 of the present exemplary embodiment is provided with wirings of a plurality of scanning lines 101, a plurality of signal lines 102 extending in the direction intersecting the scanning lines 101, and a plurality of power source lines 103 extending parallel to the signal lines 102. Regions separated by the scanning lines and the signal lines are configured as pixel regions.

The signal lines are connected to a data-side driving circuit 104 provided with a shift resister, a level shifter, a video line, and an analog switch. The scanning lines 101 are connected to a scanning-side driving circuit 105 provided with a shift resister and a level shifter.

Each pixel region is provided with a switching thin film transistor 112 to supply scanning signals to a gate electrode via a scanning line 101, a storage capacitor cap to store image signals supplied from the signal line 102 via this switching thin film transistor 112, a driving thin film transistor 123 to supply image signals stored by the storage capacitor cap to the gate electrode, a pixel electrode 111 into which a driving current is fed from the power source line 103 when the pixel electrode is electrically connected to the power source line 103 via this driving thin film transistor 123, and a function layer 110 held between this pixel electrode 111 and a cathode 12. A luminescent portion A is composed of the pixel electrode 111, the counter electrode 12, and the function layer 110, and the display device 1 is configured to include a plurality of luminescent portions A in a matrix form.

According to such a configuration, when the scanning line 101 is driven, and the switching thin film transistor 112 is turned on, the potential of the signal line 102 at that time is stored by the storage capacitor cap, and the on state or off state of the driving thin film transistor 123 is determined in accordance with the condition of the storage capacitor cap. A current is fed into the pixel electrode 111 from the power source line 103 via the channel of the driving thin film transistor 123, and the current is further fed into the cathode 12 via the function layer 110. The function layer 110 emits light in accordance with the amount of the current passing therethrough.

Figure 2:
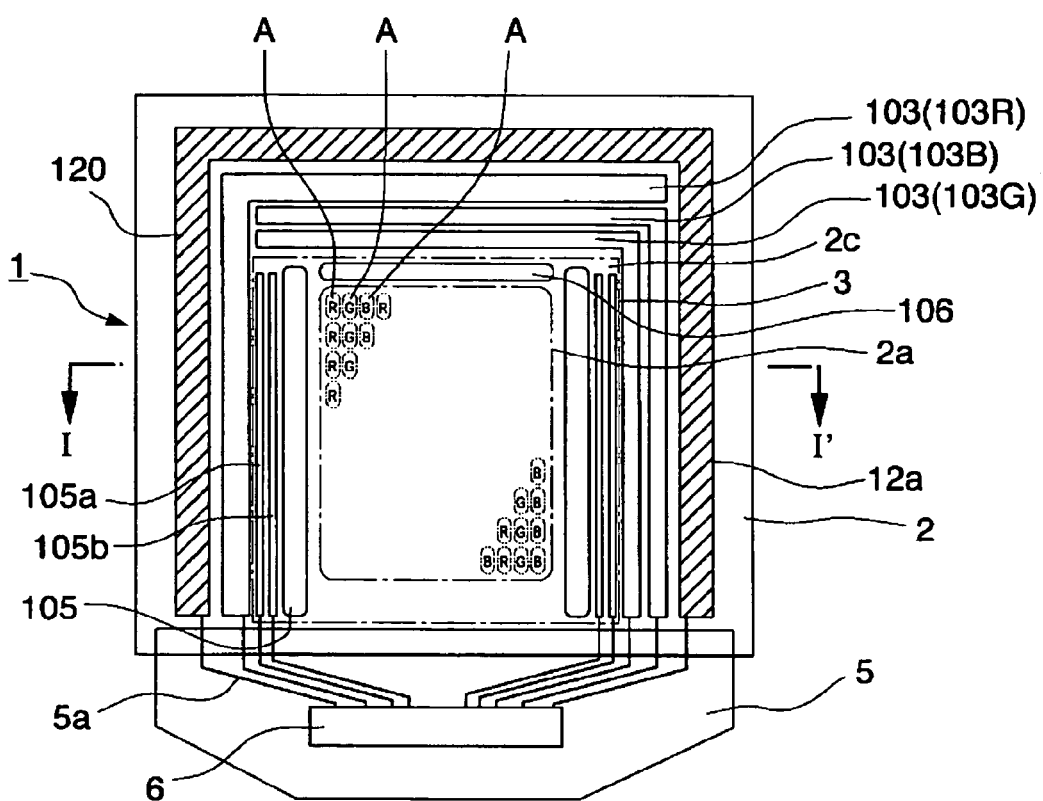
FIG. 2 is a plan view of the display device of the first exemplary embodiment.
Figure 3:
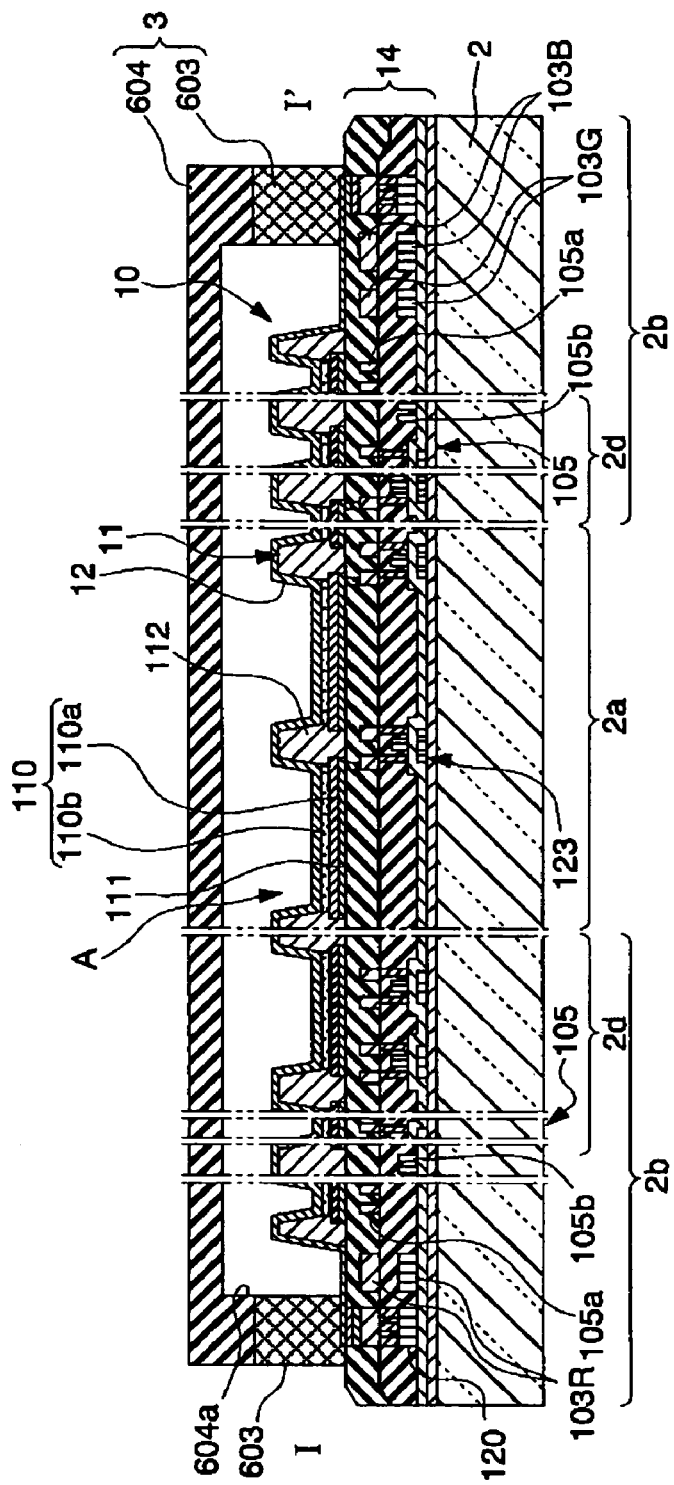
FIG. 3 is a schematic sectional view of the section indicated by a plane I-I' shown in FIG. 2.

FIG. 2 is a schematic plan view of the present display device. FIG. 3 is a schematic sectional view of the section indicated by a plane I-I' shown in FIG. 2.

As shown in FIG. 3, the display device 1 of the present exemplary embodiment has a structure in which a circuit element portion 14 and a display element portion 10 are laminated in that order on a substrate 2, and the substrate surface provided with this laminate is sealed with a sealing portion 3. The display element portion 10 is composed of a luminescent element portion 11 including a luminescent layer 110b and the cathode 12 provided on the luminescent element portion 11. This cathode 12 and the sealing portion 3 have transparency, and the present display device 1 is configured as a so-called top emission type display device in which the display light emitted from the luminescent layer emits out from the sealing portion 3.

Either transparent substrate (or translucent substrate) or opaque substrate may be used as the substrate 2. Examples of transparent or translucent substrates include glass, quartz, resins (plastic, plastic films), and the like and, in particular, inexpensive soda glass substrate is suitable for this use. Examples of opaque substrates include those in which ceramic, e.g., alumina, or a metal sheet made of stainless steel or the like is subjected to an insulation treatment, e.g., surface oxidation, and further include thermosetting resins and thermoplastic resins. As shown in FIG. 2, the substrate 2 is partitioned into a display area 2a located at the center and a non-display area 2b located in the area of the substrate 2 close to the periphery, surrounding the display area 2a.

The display area 2a is an area formed by the luminescent portions A disposed in the matrix, and the non-display area 2b is formed outside the display area. A dummy display area 2d adjacent to the display area 2a is formed in the non-display area 2b.

As shown in FIG. 3, the above-described scanning lines, signal lines, storage capacitors, switching thin film transistors, driving thin film transistors 123, and the like are provided in the circuit element portion 14, and each of the luminescent portions A disposed in the display area 2a is thereby driven.

One end of the cathode 12 on the luminescent element portion 11 is connected to a cathode wiring 120 provided on the substrate 2, and one end portion of this wiring is connected to a wiring 5a on a flexible substrate 5. The wiring 5a is connected to a driving IC 6 (driving circuit) provided on the flexible substrate 5 (refer to FIG. 2).

The wirings of the above-described power source lines 103 (103R, 103Q 103B) are provided in the non-display area 2b of the circuit element portion 14.

The above-described scanning-side driving circuits 105 and 105 are disposed in both sides of the display area 2a in FIG. 2. The scanning-side driving circuits 105 and 105 are provided in the circuit element portion 14 under the dummy area 2d. Furthermore, driving circuit control signal wirings 105a and driving circuit power source wirings 105b connected to the scanning-side driving circuits 105 and 105 are provided in the circuit element portion 14.

An inspection circuit 106 is disposed in the upper side of the display area 2a in FIG. 2. Inspections of quality and defect of the display device during manufacture and shipping can be performed by this inspection circuit 106.

The sealing portion 3 is composed of a sealing resin 603 applied to the substrate 2 and a sealing can (sealing element) 604.

The sealing resin 603 is an adhesive to adhere the substrate 2 and the sealing can 604, and is applied within the entire periphery of the substrate 2 with a microdispenser or the like. Preferably, this sealing resin 603 is composed of a thermosetting resin, ultraviolet-curing resin, or the like, and in particular, is composed of an epoxy resin which is one type of thermosetting resin. A material through which oxygen and hydrogen do not readily pass is used for this sealing resin 603. Therefore, penetration of water or oxygen into the sealing can 604 between the substrate 2 and the sealing can 604 is reduced or prevented. Consequently, oxidation of the cathode 12 or the luminescent layer 110b provided in the luminescent element portion 11 is reduced or prevented.

The sealing can 604 composed of a transparent element, e.g., glass or resin, is provided with a concave portion 604a to store the display element 10 therein, and is joined to the substrate 2 with the sealing resin 603. If necessary, a getter element to absorb or remove oxygen and water may be provided in an area of the inner surface side of the sealing can 604 which corresponds to the non-display area 2b. Examples suitable for this getter element include alkali metals, e.g., Li, Na, Rb, and Cs; alkaline-earth metals, e.g., Be, Mg, Ca, Sr, and Ba; oxides of the alkaline-earth metals; and hydroxides of the alkali metals and the alkaline-earth metals. The oxides of the alkaline-earth metals serve as dehydrators by reacting with water so as to be converted to hydroxides. Since the alkali metals and the alkaline-earth metals react with oxygen and water so as to be converted to hydroxides, these serve as not only dehydrators, but also deoxidizers. In this manner, oxidation of the luminescent portion A can be reduced or prevented, and the reliability of the device can be increased.

Figure 4:
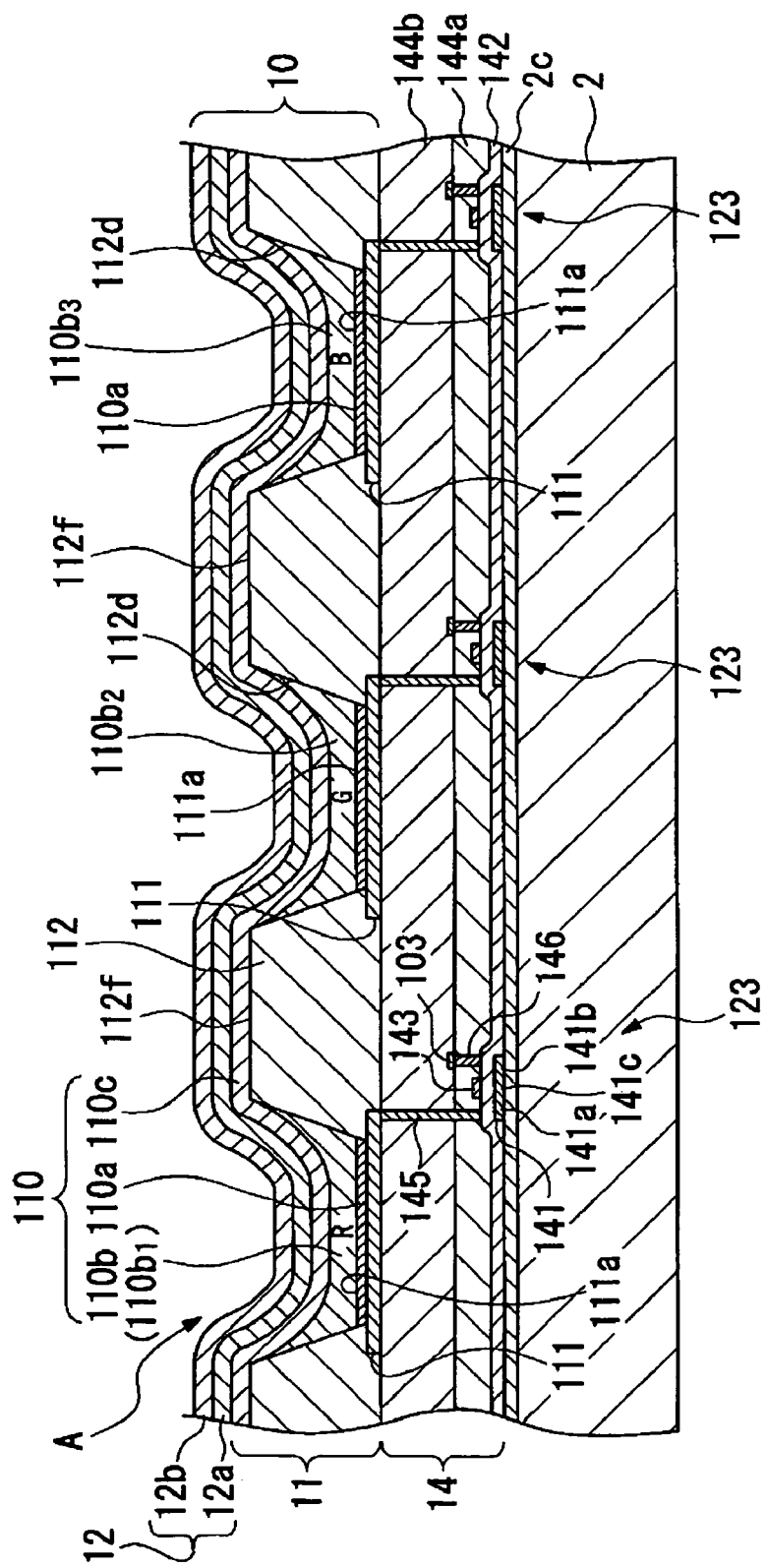
FIG. 4 is a sectional view showing the key portion of the display device of the first exemplary embodiment.

FIG. 4 is a schematic of the magnified cross-sectional structure of the display area 2a in the present display device. This display device 1 has a configuration in which the circuit element portion 14 provided with circuits of TFTs and the like, the pixel electrode 111, the luminescent element portion 11 provided with the function layer 110 including the luminescent layer 110b, and the cathode 12 are laminated in that order on the substrate 2.

In the circuit element portion 14, a substrate protective film 2c composed of a silicon oxide film is provided on the substrate 2, and island-shaped semiconductor films 141 made of polycrystalline silicon are provided on this substrate protective film 2c. The semiconductor film 141 is provided with a source region 141a and a drain region 141b by high-concentration P ion implantation. The portion in which no P is introduced serves as a channel region 141c.

A gate insulating film 142 covering the substrate protective film 2c and the semiconductor film 141 is provided in the circuit element portion 14. The gate electrode 143 (scanning line 101) made of Al, Mo, Ta, Ti, W, or the like is provided on this gate insulating film 142 while the location of the gate electrode 143 corresponds to the channel region 141c of the semiconductor film 141. The thin film transistor 123 is composed of the semiconductor film 141, the gate insulating film 142, and the gate electrode 143. This thin film transistor 123 can realize high-brightness, high-definition display because polysilicon is used for the semiconductor film 141.

A transparent first interlayer insulating film 144a and a second interlayer insulating film 144b are provided on the gate electrode 143 and the gate insulating film 142. Contact holes 145 and 146 which penetrate the insulating films 144a and 144b and which are connected to the source region 141a and the drain region 141b, respectively, are provided in the first and second interlayer insulating films 144a and 144b. The contact hole 145 is connected to the pixel electrode, and the pixel electrode 111 and the source region 141a of the semiconductor are electrically connected via this contact hole 145. The contact hole 146 is connected to the power source line 103, and pixel signals are supplied from the power source line 103 via this contact hole 146.

The circuit to drive is configured as described above. The above-described storage capacitors cap and switching thin film transistors 142 are also provided in the circuit element portion 14, although these are not shown in FIG. 4.

A plurality of pixel electrodes 111 are provided on the second interlayer insulating film 144b by patterning into the shape of a rectangle in a plan view, and are disposed in the matrix in the display area 2a.

A high-reflectance metal film, e.g., an aluminum (Al) film or a silver (Ag) film, is used for this pixel electrode 111, and the light emitted toward the substrate 2 side is caused to radiate with high efficiency through the sealing portion 3 side.

The luminescent element portion 11 is primarily composed of the function layers 110 laminated on each of the plurality of pixel electrodes 111, and bank layers 112 provided between one laminate composed of the pixel electrode 111 and the function layer 110, and another laminate of the same composition, separating the function layers 110 from each other. The cathode 12 is disposed on the function layer 110, and the luminescent portion A is composed of the pixel electrode 111, the function layer 110, and the cathode 12.

The bank layer 112 is made of a resin, e.g., an acrylic resin or a polyimide resin, having excellent heat resistance and solvent resistance, and openings 112d are provided in the locations where the pixel electrodes 111 are provided. Preferably, the thickness of the bank layer 112 is within the range of, for example, 0.1 to 3.5 µm and, in particular, about 2 µm is preferable. If the thickness is less than 0.1 µm, since the bank layer 112 becomes thinner than the total thickness of the hole injection/transportation layer and the luminescent layer, described below, the luminescent layer may undesirably overflow out from the opening 112d. If the thickness exceeds 3.5 µm, since a height difference due to the opening 112d is increased undesirably, the step coverage of the cathode 12 provided on the bank layer 112 may not be ensured. More preferably, the thickness of the bank layer 112 is 2 µm or more from the viewpoint of enhancement of insulation from the driving thin film transistor 123.

In each region separated by the bank layers 112, the electrode surface 111a of the pixel electrode 111 is subjected to a lyophilic treatment by a plasma treatment with oxygen to serve as a treatment gas and, therefore, exhibits lyophilicity. On the other hand, the wall surface of the opening 112d and the top surface 112f of the bank layer 112 exhibit liquid repellency because the surfaces thereof are subjected to a fluorination treatment (a liquid repellency treatment) by a plasma treatment with methane tetrafluoride to serve as a treatment gas.

The function layer 110 is composed of the hole injection/transportation layer 110a laminated on the pixel electrode 111, the luminescent layer 110b provided directly on the hole injection/transportation layer 110a, and an electron injection layer 110c provided directly on the luminescent layer 110b.

The hole injection/transportation layer 110a has a function of injecting holes into the luminescent layer 110b and, in addition, has a function of transporting the holes in the interior of the hole injection/transportation layer 110a. Examples of materials usable to form the hole injection/transportation layer include mixtures of polystyrenesulfonic acid, polythiophene derivatives, e.g., polyethylenedioxythiophene, and the like. The electron injection layer 110c has a function of injecting electrons into the luminescent layer 110b and, in addition, has a function of transporting the electrons in the interior of the electron injection layer 110c. Examples of materials suitable for the electron injection layer 110c include quinolinol lithium (Liq), lithium fluoride (LiF), cesium bathophen, and the like. Metals having a work function of 4 eV or less, e.g., Mg, Ca, Ba, Sr, Li, Na, Rb, Cs, Yb, and Sm, may also be used.

The hole injection/transportation layer 110a is provided between the pixel electrode 111 and the luminescent layer 110b, the electron injection layer 110c is provided between the cathode 12 and the luminescent layer 110b and, thereby, the element characteristics, e.g., the luminous efficacy and the life span, of the luminescent layer 110b are enhanced. The material for the hole injection/transportation layer may be chosen to be different on the basis of the color of the luminescent layer 110b. Alternatively, there may be no selection of hole injection/transportation layer 110a based on specific color of the luminescent layer 110b.

The luminescent layer 110b includes three types, a red (R)-emitting red luminescent layer 110b 1, a green (G)-emitting green luminescent layer 110b2, and a blue (B)-emitting blue luminescent layer 110b3. The luminescent layers 110b 1, the luminescent layers 110b2, and the luminescent layers 110b3 are disposed in respective stripes. Examples of materials used for the luminescent layers 110b include (poly)paraphenylenevinylene derivatives, polyphenylene derivatives, polyfluorene derivatives, polyvinyl carbazole, polythiophene derivatives, perylene-based coloring matters, coumarin-based coloring dyes, and rhodamine-based coloring mdyes, which are represented by chemical formula 1-Chemical formula 5, or polymers of these may be used after being doped with rubrene, perylene, 9,10-diphenylanthracene, tetraphenylbutadiene, Nile red, coumarin 6, quinacridone, or the like.

Chemical formula 1

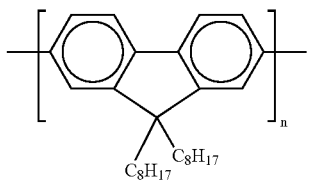

Compound 1

Chemical formula 2

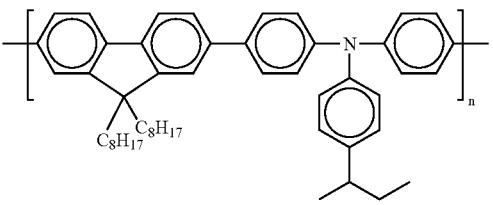

Compound 2

Chemical formula 3

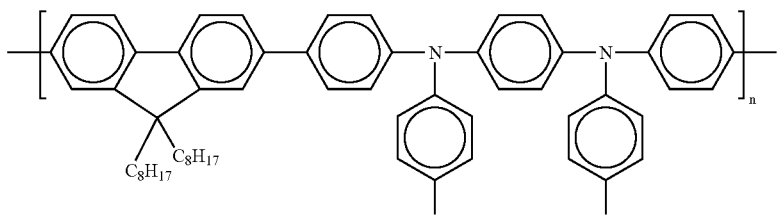

Compound 3

Chemical formula 4

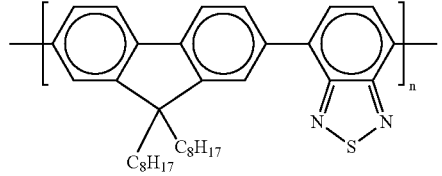

Compound 4

Chemical formula 5

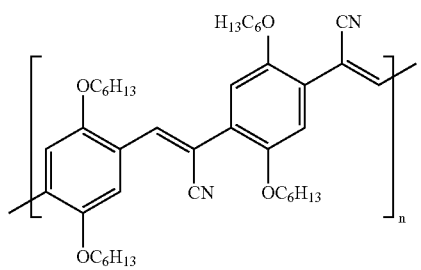

Compound 5

A conductive material made of a metal oxide, e.g., indium tin oxide (ITO) or indium zinc oxide (IZO), having transparency is used for the cathode 12, and the cathode 12 is provided all over the luminescent element portion 11. The cathode 12 and the pixel electrode 111 pair serve a function of feeding a current through the function layer 110. The oxygen content of this cathode 12 varies in the film thickness direction, and the oxygen content in the lower portion of the layer is lower than that in the upper portion of the layer. That is, the average oxygen concentration in the cathode 12 is controlled to become at least a predetermined concentration in order to attain transparency required for display, and there is a concentration gradient in the film thickness direction in which the oxygen concentration in the lower portion of the layer (toward the function layer 110) is lower than the oxygen concentration in the upper portion of the layer (toward the sealing portion 3).

For example, as shown in FIG. 4, the cathode 12 has a structure in which an oxygen-free layer 12a having an oxygen concentration of substantially zero and an oxygen-containing layer 12b having an oxygen concentration higher than the average oxygen concentration are laminated in that order from the lower surface. Such a cathode 12 is formed by sputtering a metallic material, e.g., indium (In) or tin (Sn), on the function layer 110 while the partial pressure of oxygen in the carrier gas (for example, Ar) is changed with time.

Specifically, the partial pressure of oxygen in the carrier gas is controlled to be substantially zero during a predetermined time immediately from the start of the film formation (that is, when the amount of deposition of the metal oxide on the function layer 110 is less than a predetermined film thickness) and, thereafter, the partial pressure of oxygen is increased continuously or stepwise, so that a desired average oxygen concentration can easily be attained. In this manner, the partial pressure of oxygen immediately after the start of the film formation is controlled to be substantially zero and, thereby, oxidation of the function layer 110 due to active oxygen in the carrier gas can be reduced or prevented. The film thickness of the metallic material formed while the partial pressure of oxygen is substantially zero is preferably within the range of, for example, 5 nm or more and 30 nm or less. If the supply of oxygen is started when the amount of film formed is less than 5 nm, oxygen penetrates into the function layer 110 through the grain boundaries of the metallic material formed into the film and, thereby, the function layer 110 is oxidized. On the other hand, if the film thickness of the metallic material exceeds 30 nm, the cathode 12 is darkened, and the display quality is significantly degraded.

If necessary, a protective layer made of SiO, $SiO_2$, SiN, or the like may be provided on the cathode 12 in order to reduce or prevent oxidation.

A method to manufacture the display device of the present exemplary embodiment will next be described with reference to the figures.

The method to manufacture the display device 1 of the present exemplary embodiment is configured to include, for example, (1) a bank layer formation step, (2) a plasma treatment step, (3) a hole injection/transportation layer formation step (including a first droplet discharge step), (4) a luminescent layer formation step (including a second droplet discharge step), (5) an electron injection layer formation step, (6) a cathode formation step, and (7) a sealing step. The manufacturing method is not limited to this and, if necessary, some steps may be omitted, and other steps may be added.

(1) Bank Layer Formation Step

The bank layer formation step is a step in which the bank layers 112 including the openings 112d are formed in predetermined locations on the substrate 2. The forming method will be described below.

Figure 5:
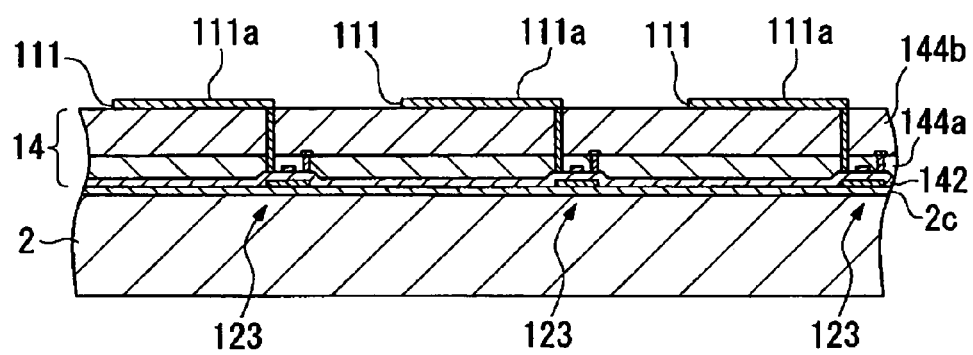
FIG. 5 is a process schematic to explain the method to manufacture the display device of the first exemplary embodiment.
Figure 6:
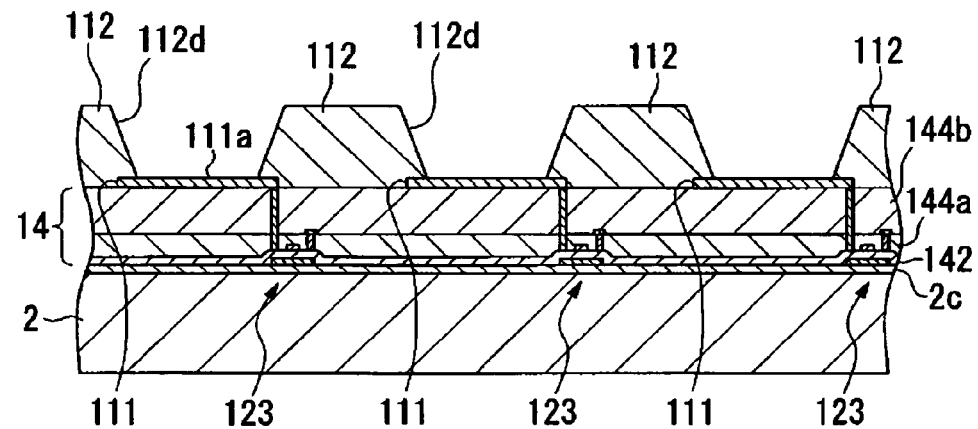
FIG. 6 is a process schematic to explain the method to manufacture the display device of the first exemplary embodiment.

As shown in FIG. 5, an element substrate is prepared, the circuit element portion 14, including scanning lines, signal lines, thin film transistors 123, and the like, being provided on the substrate 2, and a plurality of pixel electrodes 111 are provided on the interlayer insulating films 144a and 144b.

A photosensitive material having heat resistance and solvent resistance, e.g., an acrylic resin or polyimide resin, is applied to this substrate 2. The openings 112d are formed by photolithography in the regions where the pixel electrodes 111 are disposed (refer to FIG. 6). Preferably, the thickness of the bank layer is within the range of 0.1 to 3.5 µm and, in particular, is in the order of 2 µm. This range is adopted for the reasons described below.

If the thickness is less than 0.1 µm, since the bank layer 112 becomes thinner than the total thickness of the hole injection/transportation layer and the luminescent layer, described below, the luminescent layer 110b may undesirably overflow out from the opening 112d. If the thickness exceeds 3.5 µm, since a height difference due to the opening 112d is increased, undesirably, the step coverage of the cathode 12 on the opening 112d may not be ensured. Preferably, the thickness of the bank layer 112 is controlled to be 2 µm or more from the viewpoint of enhancement of insulation between the cathode 12 and the driving thin film transistor 123.

(2) Plasma Treatment Step

The plasma treatment step is performed in order to activate the surface of the pixel electrode 111 and, furthermore, to subject the surface of the bank layer 112 to a surface treatment. In particular, the activation step is performed primarily to clean the pixel electrode 111 and, furthermore, to adjust the work function. In addition, the surface of the pixel electrode 111 is subjected to a lyophilic treatment, and the surface of the bank layer 112 is subjected to a liquid repellency treatment.

This plasma treatment step is roughly classified into, for example, (2)-1 a preheating step, (2)-2 an activation treatment step (lyophilic step for imparting lyophilicity), (2)-3 a liquid-repellency imparting step, and (2)-4 a cooling step. The plasma treatment step is not limited to these steps and, if necessary, some steps may be omitted, and other steps may be added.

Figure 7:
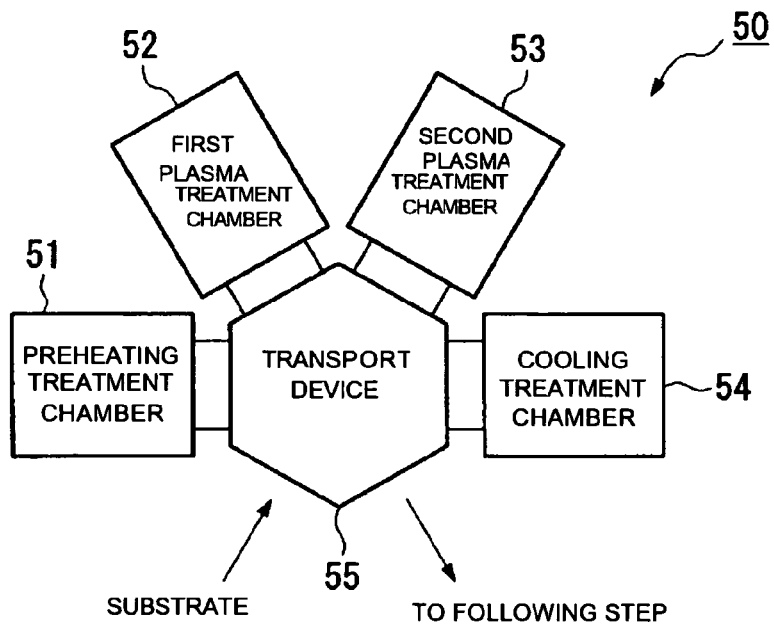
FIG. 7 is a schematic showing the plasma treatment apparatus used to manufacture the display device of the first exemplary embodiment.

FIG. 7 shows a plasma treatment apparatus used in the plasma treatment step.

The plasma treatment apparatus 50 shown in FIG. 7 is composed of a preheating treatment chamber 51, a first plasma treatment chamber 52, a second plasma treatment chamber 53, a cooling treatment chamber 54, and a transport device 55 to transport the substrate 2 to each of these treatment chambers 51 to 54. The treatment chambers 51 to 54 are disposed in a radial pattern centering around the transport device 55.

The steps in which these devices are used will next be roughly described.

The preheating step is performed in the preheating chamber 51, and the substrate 2 transported from the bank layer formation step is heated to a predetermined temperature.

After the preheating step, the lyophilic step and the liquid-repellency step are performed. That is, the substrate 2 is sequentially transported to the first and second plasma treatment chambers 52 and 53, the bank layers 112 are subjected to the plasma treatment in each of the treatment chambers 52 and 53 so as to be provided with lyophilicity. The liquid-repellency treatment is performed after this lyophilic treatment. After the liquid-repellency treatment, the substrate 2 is transported to the cooling treatment chamber, and the substrate 2 is cooled to room temperature in the cooling treatment chamber 54. After this cooling step, the substrate 2 is transported by the transport device 55 to the following step, that is, the hole injection/transportation layer formation step.

Each step will be described below in detail.

(2)-1 Preheating Step

The preheating step is performed in the preheating treatment chamber 51. The substrate 2 including the bank layers 112 is heated to a predetermined temperature in this treatment chamber 51.

The method to heat the substrate 2 adopts a procedure by which, for example, a heater is attached to a stage to carry the substrate 2, and the substrate 2 is heated by this heater together with the stage in the treatment chamber 51. However, another method may be adopted.

In this preheating treatment chamber 51, the substrate 2 is heated to, for example, between 70° C. and 80° C. This temperature is the temperature needed during the plasma treatment in the following step. It is an object of the preheating to eliminate variations in temperature of the substrate 2 by heating beforehand the substrate 2 in consideration of the following step.

If the preheating step is not applied, since the substrate 2 is heated from room temperature to the above-described temperature, the treatment is performed at an ever-varying temperature during the plasma treatment step from the start of the step to the end of the step. If the plasma treatment is performed while the temperature of the substrate is varying, unevenness may occur in the characteristics. Therefore, preheating is performed in order to keep the treatment condition constant and to attain uniform characteristics.

Consequently, in the plasma treatment step, when the lyophilicity inducing step or the liquid-repellency inducing step is performed with the substrate 2 is on the sample stage in the first and second plasma treatment devices 52 and 53, preferably, the preheating temperature is made to substantially be the same as the temperature of the sample stage 56 to continuously perform the lyophilicity inducing step or the liquid-repellency inducing step.

That is, by preheating the substrate 2 to the temperature of the sample stages, to which they are raised in the first and second plasma treatment devices 52 and 53, for example, 70° C. to 80° C., the plasma treatment conditions immediately after the start of the treatment and immediately before the end of the treatment can be kept substantially constant even when a plurality of substrates are continuously subjected to the plasma treatment. In this manner, the surface treatment conditions of the substrates 2 are made the same, the wettability of the bank layers 112 with respect to the composition is made uniform, and a display device having consistent quality can be prepared.

Also, by preheating the substrate 2, the time required for the following plasma treatment can be reduced.

(2)-2 Activation Treatment

The activation treatment is performed in the first plasma treatment chamber 52. The activation treatment includes the adjustment and the control of the work function of the pixel electrodes 111, the cleaning of the pixel electrode surfaces, and the lyophilic treatment of the pixel electrode surfaces.

Figure 8:
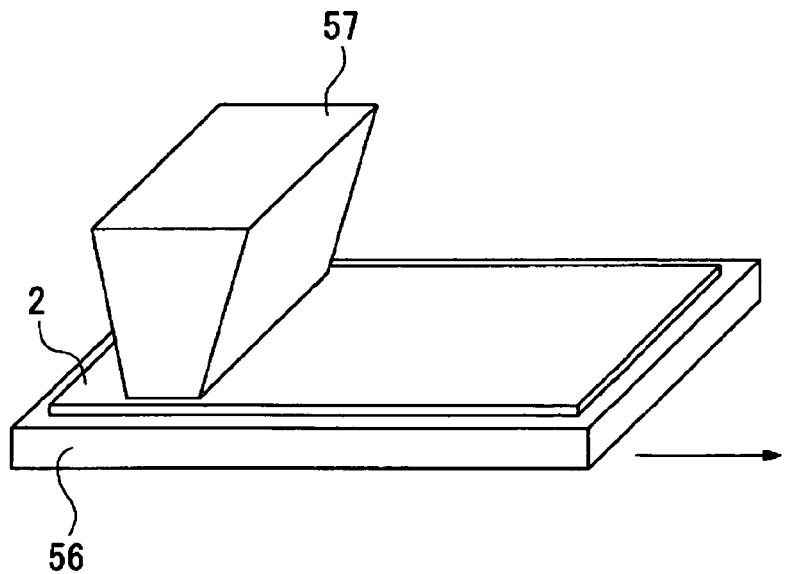
FIG. 8 is a schematic of the internal structure of the first plasma treatment chamber of the plasma treatment apparatus shown in FIG. 7.

For the lyophilic treatment, plasma treatment ($O_2$ plasma treatment), with oxygen to serve as the treatment gas, is performed in an atmosphere of air. FIG. 8 is a schematic showing a first plasma treatment. As shown in FIG. 8, the substrate 2, including the bank layers 112, is put on a sample stage 56 with a built-in heater, and a plasma discharge electrode 57 facing the substrate 2 is disposed above the substrate 2 with a gap distance on the order of 0.5 to 2 mm. The sample stage 56 is transported in the direction indicated by an arrow shown in the figure while the substrate 2 is heated by the sample stage 56 and, furthermore, oxygen in a plasma state is applied to the substrate 2 at the same time.

The $O_2$ plasma treatment is performed under the condition in which, for example, plasma power is 100 to 800 kW, an oxygen gas flow rate is 50 to 100 ml/min, substrate transport rate is 0.5 to 10 mm/sec, and substrate temperature is 70° C. to 90° C. The heating by the sample stage 56 is performed primarily in order to maintain the temperature of the preheated substrate 2.

Figure 9:
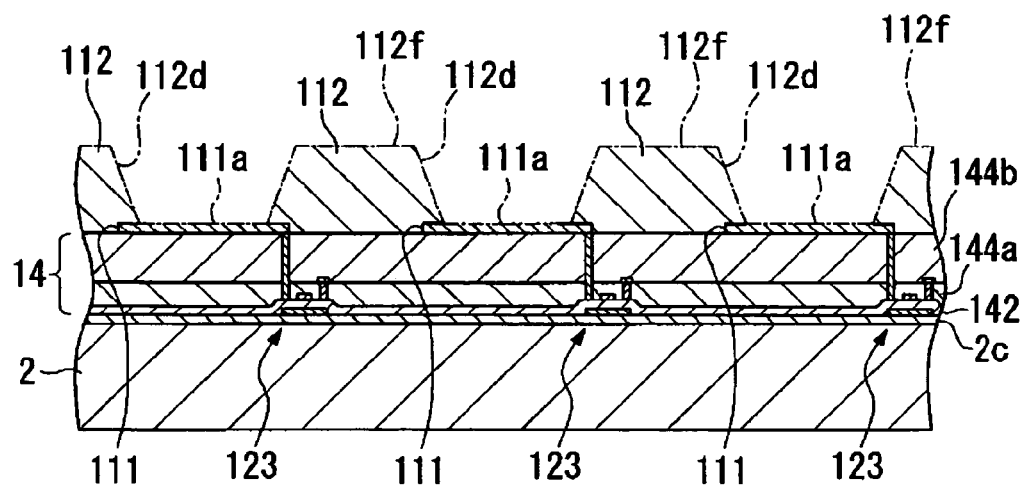
FIG. 9 is a process schematic to explain the method to manufacture the display device of the first exemplary embodiment.

With this $O_2$ plasma treatment, as shown in FIG. 9, electrode surfaces 111a of the pixel electrodes 111, and wall surfaces of the openings 112d and top surfaces 112f of the bank layers 112 are given lyophilic treatment. Hydroxyl groups are introduced into each of these surfaces by this lyophilic treatment and, thereby, the lyophilicity is imparted.

In FIG. 9, the portion subjected to the lyophilic treatment is shown by the dot-dash lines.

This $O_2$ plasma treatment not only imparts the lyophilicity, but also cleans the surfaces of the pixel electrodes 111 and adjusts the work function, as described above.

(2)-3 Liquid-Repellency Treatment Step

In the second plasma treatment chamber 53, the liquid-repellency step including plasma treatment ($CH_4$ plasma treatment) with a fluoride-containing gas, e.g., tetrafluoromethane, serving as the treatment gas, is performed in an atmosphere of air. The internal structure of the second plasma treatment chamber 53 is the same as the internal structure of the first plasma treatment chamber 52 shown in FIG. 8. That is, the substrate 2 is transported together with the sample stage 56 at a predetermined transport rate while being heated by the sample stage and, furthermore, the treatment gas in a plasma state is applied to the substrate 2 at the same time.

The $CF_4$ plasma treatment is performed under the condition in which, for example, plasma power is 100 to 800 kW, tetrafluoromethane gas flow rate is 50 to 100 ml/min, substrate transport rate is 0.5 to 10 mm/sec, and substrate temperature is 70° C. to 90° C. The heating by the heating stage is performed primarily in order to maintain the temperature of the preheated substrate 2 as in the first plasma treatment chamber 52.

The treatment gas is not limited to tetrafluoromethane, and other fluorocarbon-based gases may be used.

Figure 10:
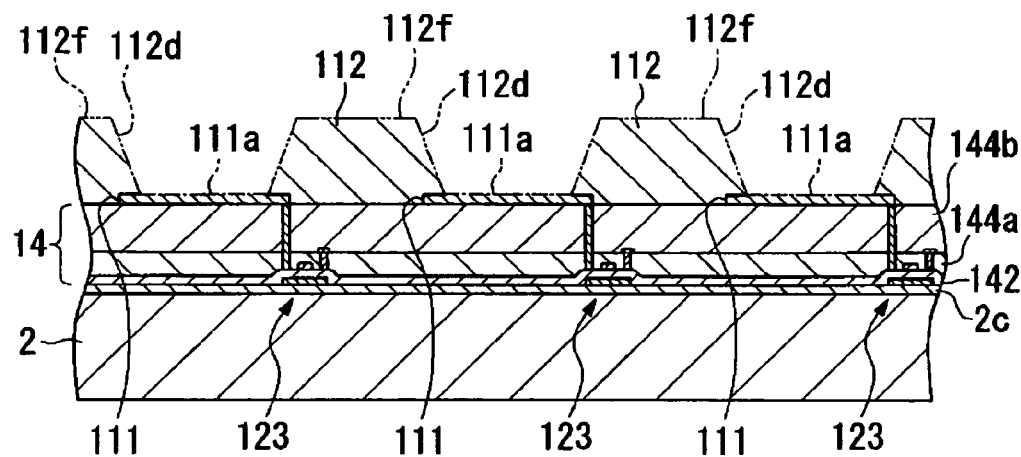
FIG. 10 is a process schematic to explain the method to manufacture the display device of the first exemplary embodiment.

According to this $CF_4$ plasma treatment, as shown in FIG. 10, wall surfaces of the openings 112d and top surfaces 112f of the bank layers 112 are subjected to the liquid-repellency treatment. Fluorine groups are introduced into each of these surfaces by this liquid-repellency treatment and, thereby, the liquid-repellency is imparted. In FIG. 10, the regions exhibiting the liquid-repellency are shown by dot-dot-dash lines.

The electrode surfaces 111a of the pixel electrodes 111 are slightly affected by this $CF_4$ plasma treatment. However, the wettability is hardly at all affected. In FIG. 10, the regions exhibiting lyophilicity are shown by dot-dash lines.

(2)-4 Cooling Step

In the cooling step, the cooling treatment chamber 54 is used, and the substrate 2 heated for the plasma treatment is cooled to a control temperature. This step is performed in order to cool to the control temperature of the following ink-jet step (droplet discharge step).

This cooling treatment chamber 54 includes a plate to arrange the substrate 2, and the plate has a structure in which a water-cooling device to cool the substrate 2 is built in.

By cooling the substrate 2 after it is given the plasma treatment to room temperature or a predetermined temperature (for example, a control temperature to perform the ink-jet step), the temperature of the substrate 2 is kept constant during the following hole injection/transportation layer formation step and, therefore, the following step can be performed at a uniform temperature without temperature change of the substrate 2. In this manner, the material discharged by a discharge device, e.g., an ink-jet method, can be uniformly formed. For example, when a first composition containing a material forming the hole injection/transportation layer is discharged, the first composition can be continuously discharged at a constant volume and, thereby, the hole injection/transportation layers can be formed uniformly.

(3) Hole Injection/Transportation Layer Formation Step

In the electroluminescent element formation step, the hole injection/transportation layers are formed on the pixel electrodes 111.

In the hole injection/transportation layer formation step, the first composition containing a material to form the hole injection/transportation layers is discharged onto the electrode surfaces 111a by the use of, for example, an ink-jet apparatus to discharge droplets (first droplet discharge step). Subsequently, a drying treatment and a heat treatment are performed so as to form hole injection/transportation layers 110a on the pixel electrodes 111.

Preferably, this hole injection/transportation layer formation step and the following steps are performed in a water-free, oxygen-free atmosphere. For example, this step is performed preferably in an inert gas atmosphere, e.g., a nitrogen atmosphere or an argon atmosphere.

The manufacturing method by the ink jet is as described below.

Figure 11:
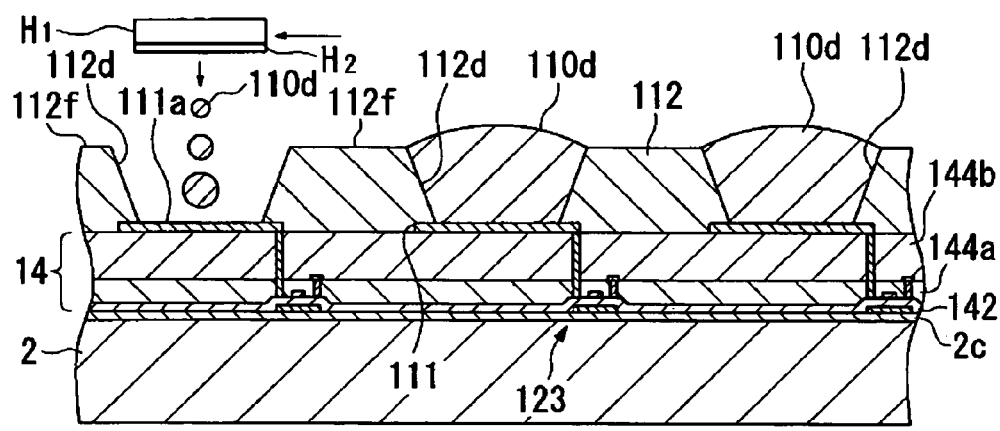
FIG. 11 is a process schematic to explain the method to manufacture the display device of the first exemplary embodiment.

As shown in FIG. 11, the first composition 110d containing the material to form the hole injection/transportation layers is discharged from a plurality of nozzles provided on an ink-jet head H1. Here, the composition 110d is filled in each opening 112d, scanning by moving the ink-jet head. However, alternatively the substrate 2 may be moved. Furthermore, the composition 110d may also be filled in by moving the ink-jet head H1 and the substrate 2 relative to each other. The above-described point holds true for steps performed downstream of this step using the ink-jet head H1.

The discharge by the ink-jet head H1 will be described below. The discharge nozzle H2 provided on the ink-jet head H1 is arranged facing the electrode surface 111a, and the first composition 110d is discharged from the nozzle H2. The bank layers 112 are provided around the pixel electrode 111. The ink-jet head H1 is faced to the electrode surface 111a located in the opening 112d of the bank layer 112, and the first composition droplets 110d are discharged from the discharge nozzle H2 onto the electrode surface 111a while the amount of liquid per droplet is controlled and the ink-jet head H1 and the substrate 2 are moved relative to each other.

For example, a composition in which a mixture of a polythiophene derivative, e.g., polyethylenedioxythiophene (PEDOT), polystyrenesulfonic acid (PSS), and the like is dissolved into a polar solvent may be used as the first composition 110d used here. Examples of polar solvents include isopropyl alcohol (IPA), n-butanol, γ-butyrolactone, N-methyl pyrrolidone (NMP), 1,3-dimethyl-2-imidazolidinone (DMI) and derivatives thereof, and glycol ethers, e.g., carbitol acetate and butylcarbitol acetate.

The first composition may have a further specific composition of, for example, a PEDOT/PSS mixture (PEDOT/PSS=1:20): 12.52% by weight, IPA: 10%, NMP: 27.48%, and DMI: 50% t. Preferably, the viscosity of the first composition is in the order of 2 to 20 mPa·s, in particular, is in the order of 4 to 15 mPa·s.

By using the above-described first composition, the discharge nozzle H2 is not clogged and, therefore, discharge can be performed stably.

With respect to the materials to form the hole injection/transportation layers, the same material may be used for each of the luminescent layers 110b 1 to 110b3 of red (R), green (G), and blue (B), or the material may be changed for each luminescent layer.

As shown in FIG. 11, discharged first composition droplets 110d spread on the electrode surface 111a which had been given lyophilic treatment, and collect in the opening 112d. Even if the first composition droplets 110d is discharged onto the top surface 112f outside the predetermined discharge position, the top surface 112f is not wetted by the first composition droplet 110d, and the repelled first composition droplet 110d tumbles into the opening 112d.

The amount of the first composition discharged onto the electrode surface 111a is determined based on the size of the opening 112d, the thickness of the hole injection/transportation layer to be formed, the concentration of the material to form the hole injection/transportation layer in the first composition, and the like. The first composition droplets 110d need not be discharged at one time, and the composition substance may be divided among several discharges on the same electrode surface 111a. At this time, the amount of the first composition substance used in each discharge may be the same, or the amount of the first composition substance may be changed for each discharge.

Figure 13:
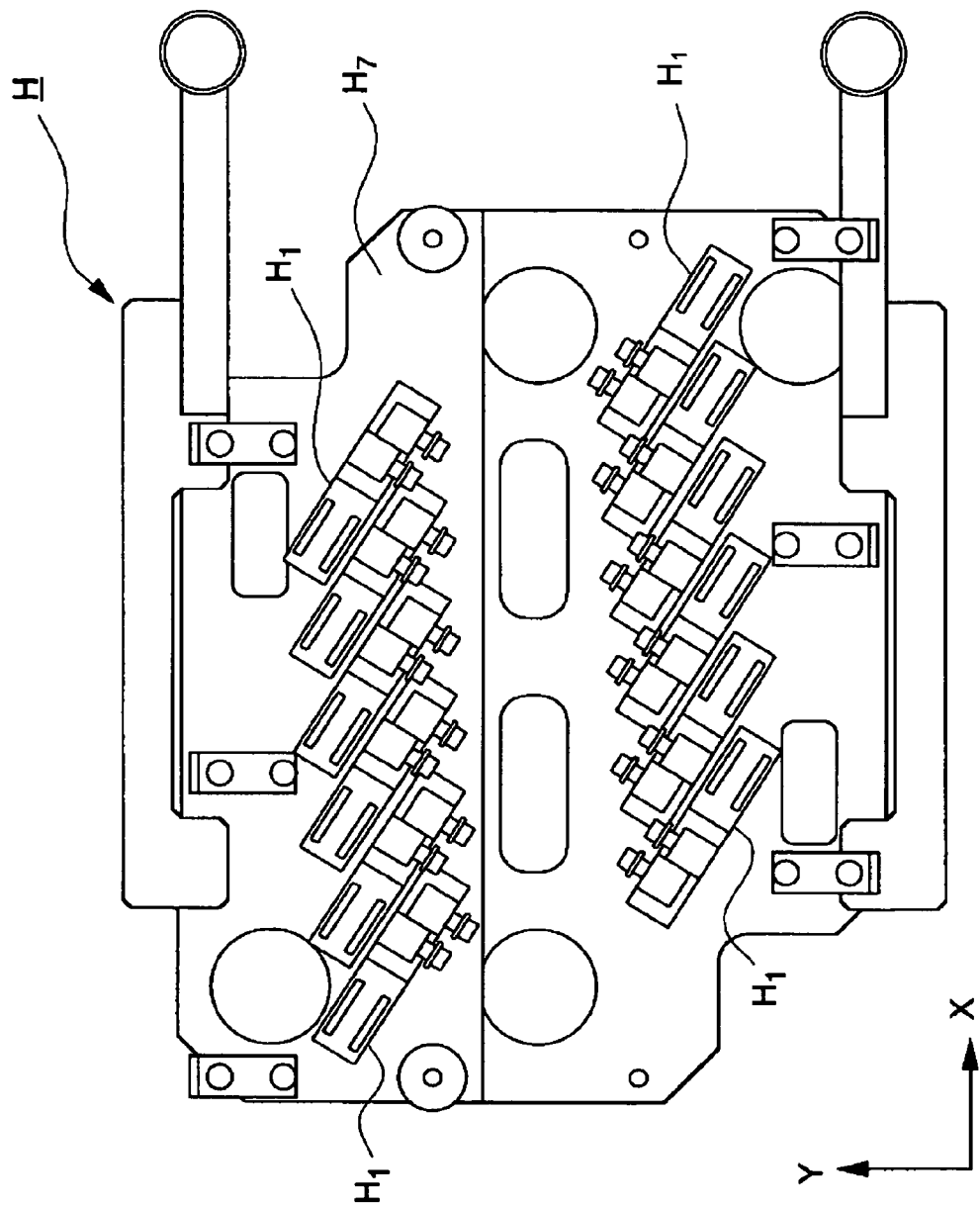
FIG. 13 is a plan view showing a head used to manufacture the display device of the first exemplary embodiment.
Figure 14:
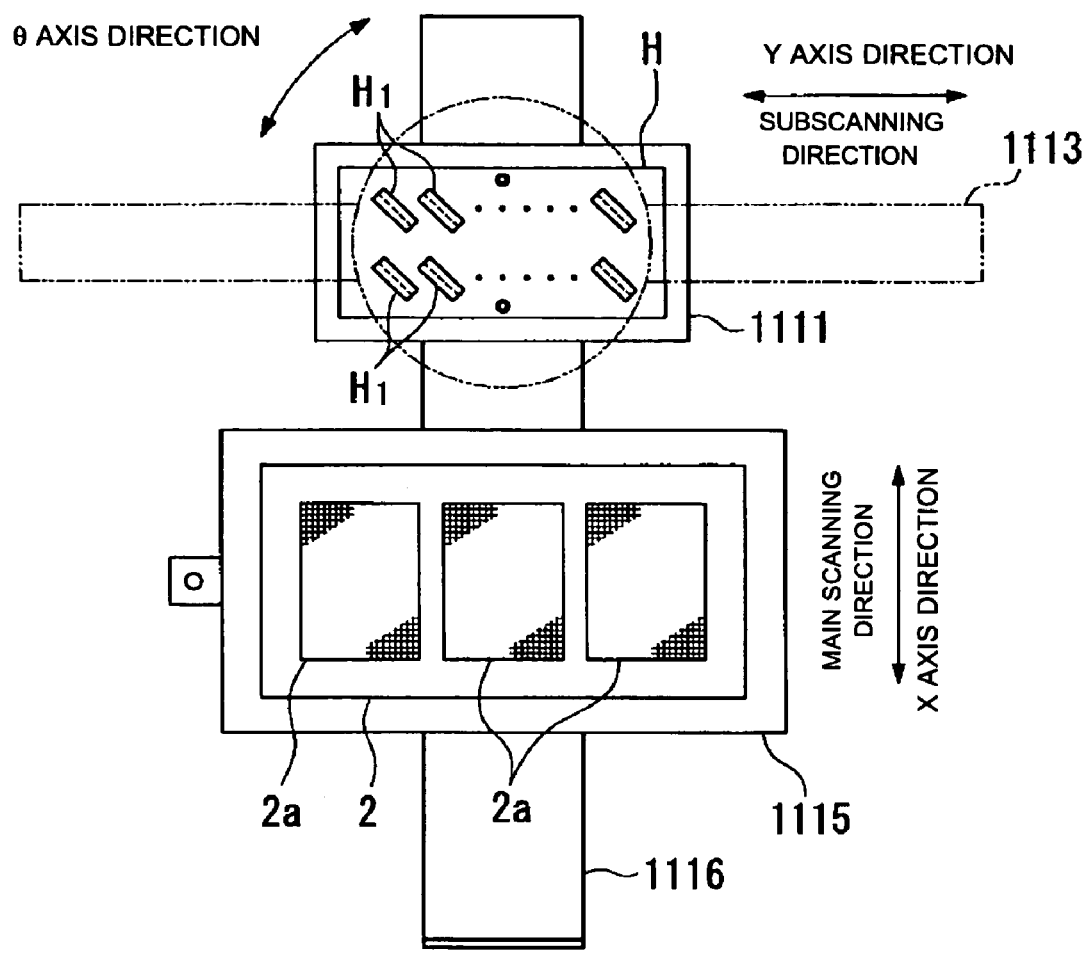
FIG. 14 is a plan view showing an ink-jet apparatus used to manufacture the display device of the first exemplary embodiment.

With respect to the structure of the ink-jet head, a head H shown in FIG. 13 may be used. With respect to the arrangement of the substrate and the ink-jet head, the arrangement shown in FIG. 14 is preferable. In FIG. 13, reference numeral H7 denotes a support substrate to support the above-described ink-jet heads H1, a plurality of ink-jet heads H1 provided on this support substrate H7.

A plurality of discharge nozzles are disposed in two rows along the length direction of the head with a spacing in the width direction of the head (for example, 180 nozzles each row, 360 nozzles in total) on the ink discharge surface (surface facing the substrate 2) of the ink-jet head H1. In addition to the discharge nozzles of this ink-jet head H1 being made to face toward the substrate 2, a plurality of ink-jet heads H1 are positioned and supported by the support substrate H7 substantially having the shape of a rectangle in a plan view, the ink-jet heads H1 disposed in two rows substantially along the X axis direction with each head inclined from the X axis (or Y axis) at a predetermined angle and spaced from each other in the Y direction (6 units each row, 12 units in total, in FIG. 13).

In an ink-jet apparatus shown in FIG. 14, reference numeral 1115 denotes a stage carrying the substrate 2, and reference numeral 1116 denotes a guide rail to guide the stage 1115 in the X direction (main scanning direction) shown in the figure. The head H can be moved in the Y direction (subscanning direction) shown in the figure by moving the guide rail 1113 via a support element 1111. Furthermore, the head H can be rotated in the θ axis direction in the figure, and the ink-jet heads H1 can be positioned to be inclined from the main scanning direction at a predetermined angle. The nozzle pitch is made to correspond to the pixel pitch by arranging the ink-jet head to incline from the scanning direction, as described above. The nozzle pitch is made to correspond to any pixel pitch by adjusting the angle of inclination.

The substrate 2 shown in FIG. 14 has a structure in which a plurality of chips are disposed on the mother substrate. That is, the area of one chip corresponds to one display device. Here, three display areas 2a are provided, although not limited to this. For example, when the composition is applied to a left display area 2a on the substrate 2, the head H is moved to the left in the figure via the guide rail 1113, the substrate 2 is moved upward in the figure via the guide rail 1116, and the scanning application is performed while the substrate 2 is thus moved. Thereafter, the head H is moved to the right in the figure, and the composition is applied to the display area 2a located in the center of the substrate. The same holds true for the display area 2a located in the right end.

The head H shown in FIG. 13 and the ink-jet apparatus shown in FIG. 14 may be used for not only the hole injection/transportation layer formation step, but also the luminescent layer formation step.

Figure 12:
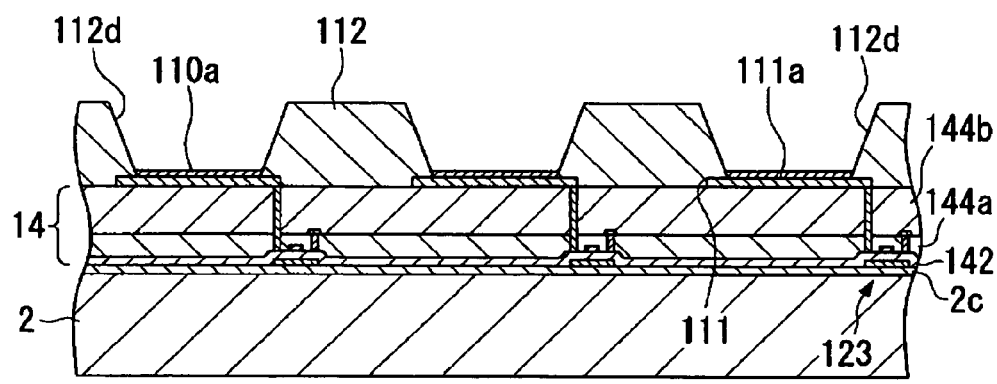
FIG. 12 is a process schematic to explain the method to manufacture the display device of the first exemplary embodiment.

Subsequently, the drying step is performed. The polar solvent contained in the first composition is vaporized, and the material to form the hole injection/transportation layer is precipitated, as shown in FIG. 12. This drying step is performed, for example, in a nitrogen atmosphere at room temperature at a pressure in the order of 133.3 Pa (1 Torr). If the pressure is too low, undesirably, bumping of the first composition droplets 110d occurs. If the temperature is more than room temperature, the vaporization rate of the polar solvent is increased and, thereby, a flat film cannot be formed.

After the drying treatment, preferably, the polar solvent and water remaining in the hole injection/transportation layer 110a are removed by a heat treatment in which heating is performed for about 10 minutes at 200° C. in nitrogen, preferably, in a vacuum.

Most of the thus formed hole injection/transportation layer 110a dissolves into the luminescent layer 110b which is applied in a downstream step. However, a part thereof remains as a thin film between the hole injection/transportation layer 110a and the luminescent layer 110b. In this manner, an energy barrier between the hole injection/transportation layer 110a and the luminescent layer 110b is lowered, and the movement of the holes is facilitated and, therefore, the luminous efficacy can be enhanced.

(4) Luminescent Layer Formation Step

The luminescent layer formation step is composed of a surface modification step, a luminescent layer formation material discharge step (second droplet discharge step), and a drying step.

The surface modification step is performed in order to enhance the adherence between the hole injection/transportation layer 110a and the luminescent layer 110b and to enhance the uniformity in the film formation. That is, in the luminescent layer formation step, a nonpolar solvent which cannot dissolve the hole injection/transportation layer 110a is used as a solvent of the second composition used to form the luminescent layer, in order to reduce or prevent further dissolution of the hole injection/transportation layer 110a. On the other hand, since the hole injection/transportation layer 110a has low affinity for the nonpolar solvent, the hole injection/transportation layer 110a and the luminescent layer 110b cannot be made to adhere closely to each other, or the luminescent layer 110b cannot be uniformly applied, when the second composition containing the nonpolar solvent is discharged onto the hole injection/transportation layer 110a.

Therefore, preferably, the surface modification step is performed in advance of the formation of the luminescent layer in order to enhance the affinity of the surface of the hole injection/transportation layer 110a for the luminescent layer formation material.

In the surface modification step, a surface modifying agent which is the same or the same type of solvent as the nonpolar solvent of the second composition used to form the luminescent layer is applied onto the hole injection/transportation layer 110a by an ink-jet method (droplet discharge method), a spin coating method, or a dipping method and, thereafter, drying is performed.

Examples of usable surface modifying agents, which are the same solvent as the nonpolar solvent of the second composition, include cyclohexylbenzene, dihydrobenzofuran, trimethylbenzene, tetramethylbenzene, and the like. Examples of surface modifying agents which are the same type of solvent as the nonpolar solvent of the second composition include toluene, xylene, and the like.

By performing such a surface modification step, the surface of the hole injection/transportation layer 110a becomes compatible with the nonpolar solvent, and the second composition containing the luminescent layer formation material can be uniformly applied to the hole injection/transportation layer 110a in a downstream step.

The above-described Compound 2 or the like which is generally used as a material having a hole transportation property may be dissolved into the above-described surface modification agent so as to prepare a composition. The resulting composition may be applied onto the hole injection/transportation layer 110a by an ink-jet method, followed by drying, so that an extremely thin hole transportation layer may be formed on the hole injection/transportation layer 110a.

In the luminescent layer formation step, the second composition containing the luminescent layer formation material is discharged onto the hole injection/transportation layer 110a by an ink-jet method (droplet discharge method) and, thereafter, a drying treatment is performed, so that the luminescent layer 110b is formed on the hole injection/transportation layer 110a.

Figure 15:
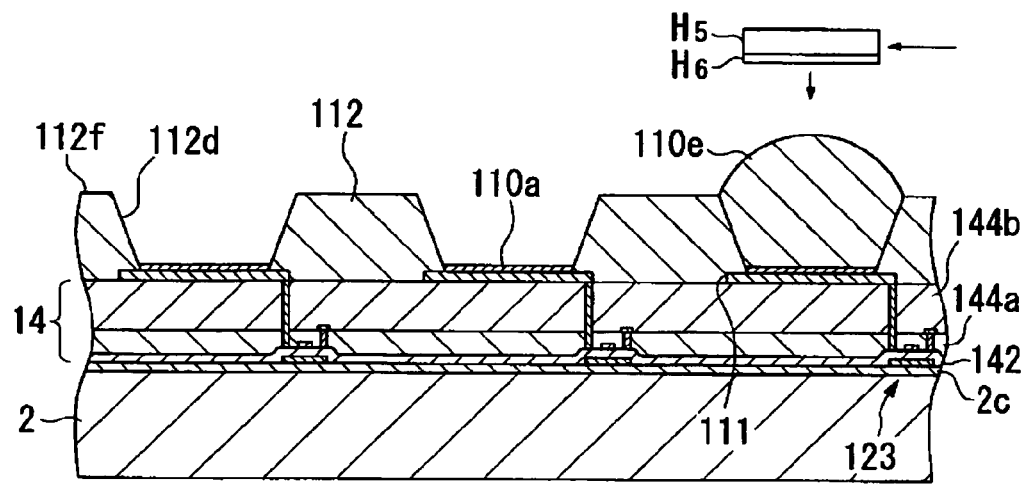
FIG. 15 is a process schematic to explain the method to manufacture the display device of the first exemplary embodiment.

FIG. 15 shows a discharge method by the ink jet. As shown in FIG. 15, an ink-jet head H5 and the substrate 2 are moved relative to each other, and a second composition 110e containing a luminescent layer formation material of one color (for example, blue (B), in this case) is discharged from a discharge nozzle H6 provided on the ink-jet head H5.

To conduct discharge, the discharge nozzle is made to face the hole injection/transportation layer 110a located in the opening 112d, and the second composition is discharged onto the hole injection/transportation layer 110a while the ink-jet head H5 and the substrate 2 are moved relative to each other. The amount of the liquid discharged from the discharge nozzle H6 is controlled by controlling the amount of liquid per droplet.

Examples of materials used for the luminescent layer formation material include polyfluorene-based macromolecule derivatives, (poly)paraphenylenevinylene derivatives, polyphenylene derivatives, polyvinyl carbazole, polythiophene derivatives, perylene-based coloring dyes, coumarin-based coloring dyes, and rhodamine-based coloring dyes, which are represented by chemical formula 1-chemical formula 5, or the above-described macromolecules may be used after being doped with rubrene, perylene, 9,10-diphenylanthracene, tetraphenylbutadiene, Nile red, coumarin 6, quinacridone, or the like.

Preferably, the nonpolar solvent does not dissolve the hole injection/transportation layer 110a, and examples thereof include cyclohexylbenzene, dihydrobenzofuran, trimethylbenzene, and tetramethylbenzene.

The second composition can be applied without further dissolution of the hole injection/transportation layer 110a by using such a nonpolar solvent for the second composition of the luminescent layer 110b.

As shown in FIG. 15, discharged second composition 110e spreads on the hole injection/transportation layer 110a, and fills up the opening 112d. On the other hand, even if the second composition droplet 110e is discharged onto the top surface 112f outside the predetermined discharge position, the top surface 112f subjected to the liquid-repellency treatment is not wetted by the second composition droplet 110e, and the second composition droplets 110e tumble into the opening 112d.

The amount of the second composition substance 110e discharged onto each hole injection/transportation layer 110a is determined based on the size of the opening 112d, the thickness of the luminescent layer 110b to be formed, the concentration of the material for the luminescent layer in the second composition, and the like.

The second composition substance 110e may be discharged all at one time or may be divided among several discharges onto the same hole injection/transportation layer 110a. At this time, the amount of the second composition substance used in each discharge may be the same, or the amount of liquid of the second composition substance 110e may be changed with each discharge.

Figure 16:
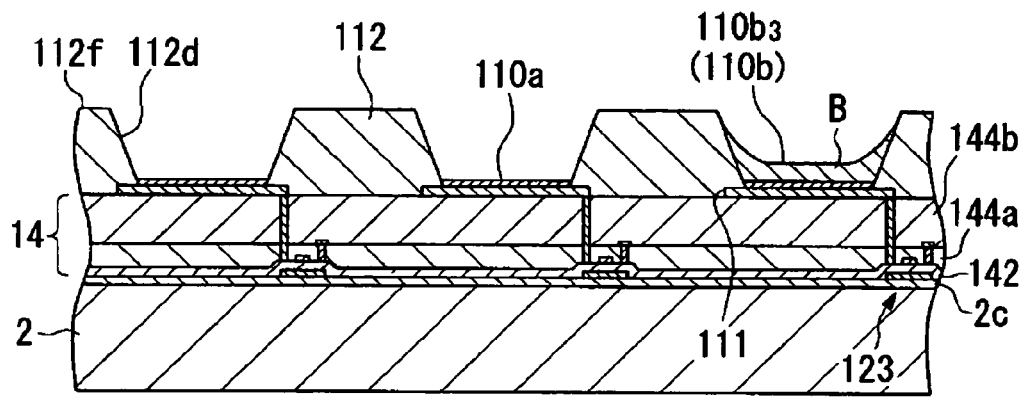
FIG. 16 is a process schematic to explain the method to manufacture the display device of the first exemplary embodiment.

After the discharge of the second composition onto the predetermined location is completed, the second composition droplets 110e discharged are subjected to a drying treatment and, thereby, the nonpolar solvent contained in the second composition is vaporized. In this manner, the luminescent layer formation material is deposited, and a blue (B) luminescent layer 110b3 shown in FIG. 16 is formed. In FIG. 16, only one blue-emitting luminescent layer is shown. However, as is clear from FIG. 2 and other figures, the luminescent elements are provided essentially in a matrix and, therefore, a plurality of luminescent layers (corresponding to blue) are provided, although not shown in the figure.

Figure 17:
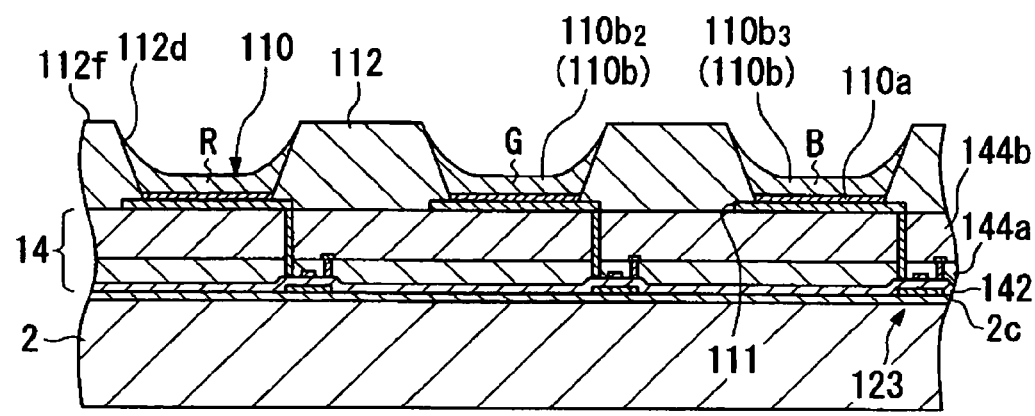
FIG. 17 is a process schematic to explain the method to manufacture the display device of the first exemplary embodiment.

Subsequently, as shown in FIG. 17, a red (R) luminescent layer 110b1 is formed, and finally a green (G) luminescent layer 110b2 is formed through steps as in the above-described blue (B) luminescent layer 110b3.

The order of the formation of the luminescent layers 110b is not limited to the above-described order, and the formation may be performed in any order. For example, the order of the formation may be determined depending on the luminescent layer formation material.

With respect to the drying condition of the second composition of the luminescent layer, in the case of the blue 110b3, the drying is performed, for example, in a nitrogen atmosphere at room temperature at a pressure in the order of 133.3 Pa (1 Torr) for 5 to 10 minutes. If the pressure is too low, undesirable bumping of the second composition 110e occurs. If the temperature is more than room temperature, the vaporization rate of the nonpolar solvent is increased and, large amounts of the luminescent layer formation material undesirably adhere to the wall surface of the upper opening 112d.

In the case of the green luminescent layer 110b2 and the red luminescent layer 110b 1, since the number of components of the luminescent layer is large, the drying is preferably performed in a short time. It is preferable that, for example, nitrogen is blown at 40° C. for 5 to 10 minutes.

Examples of other methods for drying include a far-infrared radiation method, a high-temperature nitrogen gas blowing method, and the like.

In this manner, the hole injection/transportation layers 110a and the luminescent layers 110b are formed on the pixel electrodes 111.

(5) Electron Injection Layer Formation Step

Figure 18:
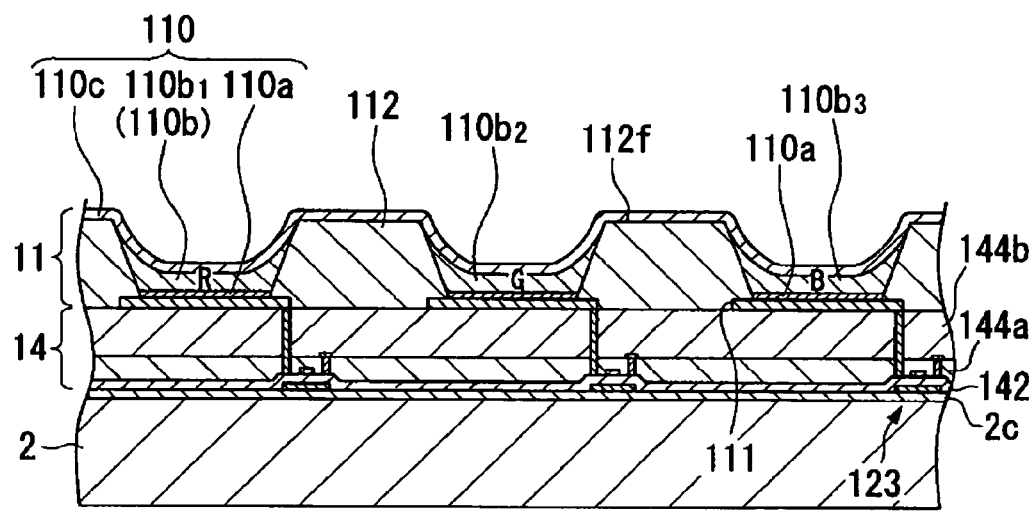
FIG. 18 is a process schematic to explain the method to manufacture the display device of the first exemplary embodiment.

In the electron injection layer formation step, as shown in FIG. 18, the electron injection layer 110c made of liquid or the like is formed all over the luminescent layers 110b and the bank layers 112.

Preferably, the electron injection layer 110c is formed by an evaporation method, a sputtering method, a CVD method, or the like. In particular, the formation by the evaporation method is preferable from the viewpoint of prevention of damage to the luminescent layer 110b due to heat.

(6) Cathode Formation Step

In the cathode formation step, a cathode 12 made of an metal oxide, e.g., ITO, is formed all over the electron injection layer 110c by a sputtering method.

For example, an alloy of In and Sn may be used as a sputter target, and for example, argon (Ar) may be used as a carrier gas.

Figure 19:
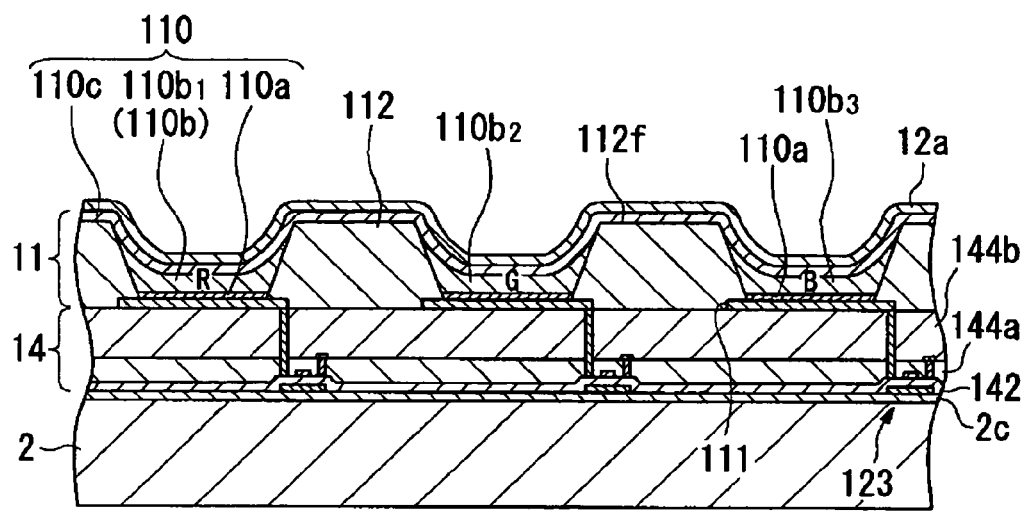
FIG. 19 is a process schematic to explain the method to manufacture the display device of the first exemplary embodiment.

In the initial stage of the film formation, the partial pressure of oxygen in the carrier gas is controlled to be substantially zero, during which a metallic material is formed into a film having a predetermined film thickness (predetermined thickness). In this manner, as shown in FIG. 19, an oxygen-free layer 12a having an oxygen content of substantially zero is formed on the electron injection layer 110c.

Figure 20:
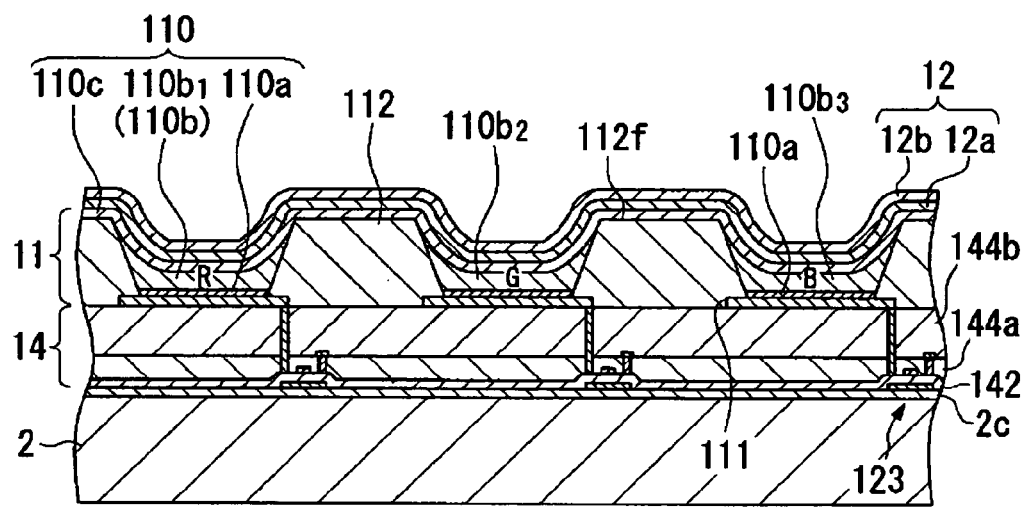
FIG. 20 is a process schematic to explain the method to manufacture the display device of the first exemplary embodiment.

Subsequently, the metal oxide is formed into a film in the order of 140 nm while the partial pressure of oxygen in the carrier gas is increased continuously or stepwise. In this manner, as shown in FIG. 20, an oxygen-containing layer 12b containing oxygen is formed on the oxygen-free layer 12a.

Preferably, the predetermined thickness (that is, the film thickness of the oxygen-free layer 12a) is within the range of 5 nm or more and 30 nm or less. For example, if supply of oxygen is started when the amount of film formation is less than 5 nm, the function layer to serve as the substrate (in the present exemplary embodiment, the electron injection layer 110c) is oxidized and, therefore, an adequate luminous efficacy cannot be achieved. On the other hand, if the oxygen-free layer 12a having a thickness exceeding 30 nm is formed, the cathode is darkened and, therefore, the display quality is significantly degraded.

The oxygen content and the film thickness of the oxygen-containing layer 12b may be set to be within the range that allows adequate transparency of the whole cathode 12 composed of the oxygen-free layer 12a and the oxygen-containing layer 12b.

(7) Sealing Step

The sealing step is a step in which a sealing can 604 is disposed at the front of the substrate 2 provided with luminescent elements, and the substrate 2 and the outer edges of the sealing can 604 are sealed together with a sealing resin 603. A sealing portion 3 is formed on the substrate 2 through this step.

Preferably, the sealing step is performed in an atmosphere of an inert gas, e.g., nitrogen, argon, helium, or the like. In a case where the cathode has a defect, such as a pinhole, if the sealing step is performed in air, undesirably, water, oxygen, or the like penetrates into the cathode 12 through this defect and, thereby, the cathode 12 is oxidized. Preferably, a getter element to absorb or remove oxygen and water is provided on the inner surface side of the sealing can 604. Desirably, this getter element is disposed in, for example, a non-display area 2b in order to avoid affecting the display.

The cathode 12 is connected to the wiring 5a of the substrate 2 shown in FIG. 2 and FIG. 3 as an example, and the wiring of the circuit element portion 14 is connected to the driving IC 6, so that the display device 1 of the present exemplary embodiment is prepared.

According to the electroluminescent display device of the present exemplary embodiment, oxidation of the function layer during cathode film formation can be effectively reduced or prevented without degradation of the transparency of the whole cathode 12.

Second Exemplary Embodiment

Figure 21:
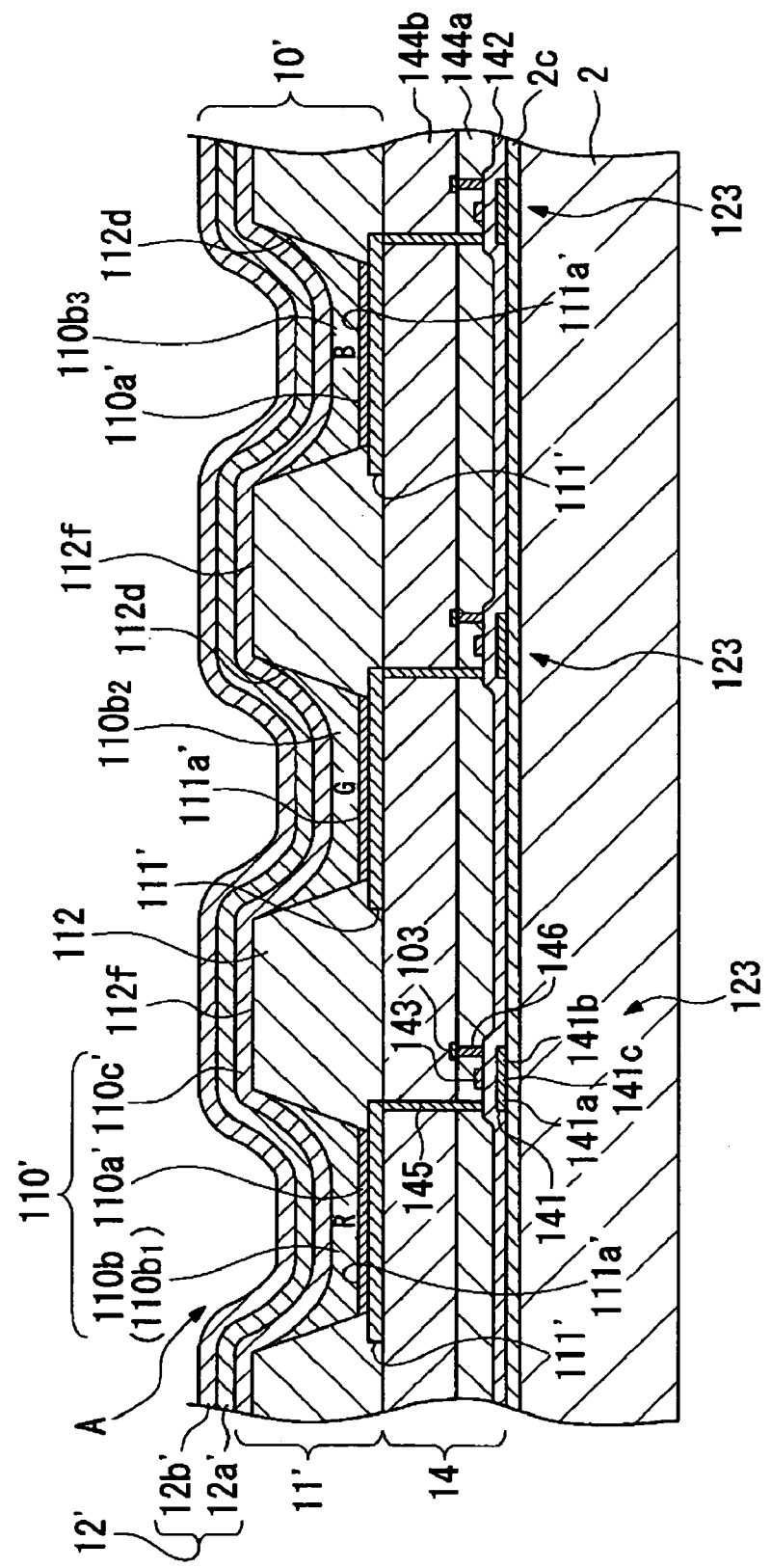
FIG. 21 is a sectional view showing the display device according to the second exemplary embodiment of the present invention.

The second exemplary embodiment of the present invention will be described with reference to FIG. 21. In the following description, portions similar to those in the above-described first exemplary embodiment are indicted by the same reference numerals as in the first exemplary embodiment, and a part of explanations thereof will not be provided. The description will be made with reference to FIG. 2 and FIG. 3 as appropriate.

An electroluminescent display device of the present exemplary embodiment is configured as an EL display device having a so-called reverse structure in which cathodes 111', electron injection layers 110a', luminescent layers 110b, a hole injection/transportation layer 110c', and an anode 12' are laminated in that order from the substrate 2 side. In the present display device, a function layer 110' is composed of the electron injection layer 110a', the luminescent layer 110b, and the hole injection/transportation layer 110c'.

The present display device has a top emission type structure as in the above-described first exemplary embodiment, a high-reflectance metal film made of Al, Ag, or the like is used for the cathode 111' to serve as a pixel electrode, and a metal oxide, e.g., ITO or IZO, having transparency is used for the anode 12' provided to cover the bank layer 112 and the function layer 110'.

The oxygen content of this anode 12' varies in the film thickness direction, and the oxygen content in the lower part of the layer (substrate 2 side) is lower than that in the upper part of the layer (sealing portion 3 side). That is, the average oxygen concentration in the anode 12' is made at least a predetermined concentration in order to attain the transparency required for display, and there is a concentration gradient in the film thickness direction in which the oxygen concentration in the lower portion is lower than the oxygen concentration in the upper portion. For example, the anode 12' has a structure in which an oxygen-free layer 12a' having an oxygen concentration of substantially zero and an oxygen-containing layer 12b' having an oxygen concentration higher than the average oxygen concentration are laminated in that order from the lower surface. Such an anode 12' is formed by sputtering a metallic material, e.g., In or Sn, on the hole injection/transportation layer 110c' while the partial pressure of oxygen in the carrier gas (for example, Ar) is changed with time. Specifically, the partial pressure of oxygen in the carrier gas is controlled to be substantially zero during a predetermined time starting immediately after the start of the film formation (that is, when the amount of film formed on the hole injection/transportation layer 110c' is within a predetermined range) and, thereafter, the partial pressure of oxygen is increased continuously or stepwise, so that a desired average oxygen concentration can be attained.

One end of this anode 12' is connected to the wiring 120 provided on the substrate 2, and one end portion of this wiring 120 is connected to a wiring 5a on a flexible substrate 5. The wiring 5a is connected to a driving IC 6 (driving circuit) provided on the flexible substrate 5 (refer to FIG. 2 and FIG. 3).

Since the configuration except for this is similar to that in the above-described first exemplary embodiment, explanations thereof will not be provided.

Consequently, in the present exemplary embodiment as well, oxidation of the function layer due to active oxygen in the carrier gas can be reduced or prevented without degradation of the transparency of the whole anode, as in the above-described first exemplary embodiment.

Electronic Equipment

An example of electronic equipment provided with the above-described electroluminescent display device will be described below.

Figure 22:
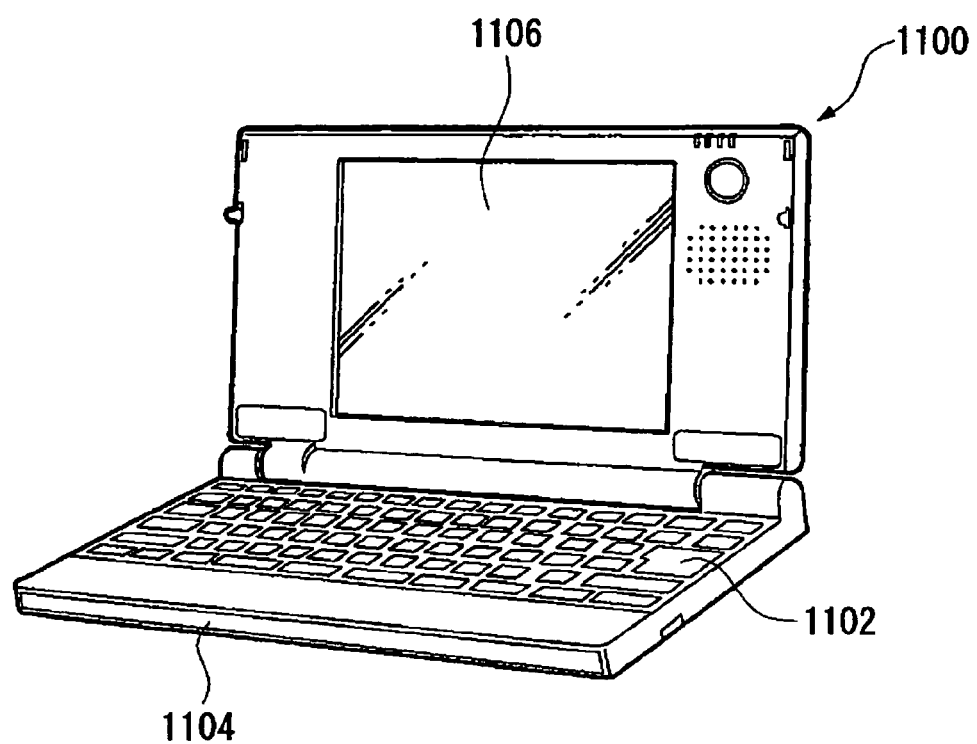
FIG. 22 is a schematic showing an example of electronic equipment of the present invention.

FIG. 22 is a perspective view showing the configuration of a mobile type personal computer (information processing apparatus) provided with the display device according to the above-described exemplary embodiments. As shown in the aforementioned figure, the personal computer 1100 is composed of a main body portion 1104 provided with a keyboard 1102, and a display device unit provided with the above-described electroluminescent display device 1106. Consequently, electronic equipment including a bright display portion having a high luminous efficacy can be provided.

The present invention is not limited to the above-described exemplary embodiments, and any modifications may be performed within the scope of the present invention.

For example, in the above-described exemplary embodiment, the partial pressure of oxygen immediately after the start of the film formation is controlled to be substantially zero in the film formation of the cathode by sputtering. However, the present invention is not limited to this, and it is only essential that the partial pressure of oxygen immediately after the start of the film formation is made lower than the average oxygen partial pressure during the film formation. In this manner, damage to the function layer 110 to serve as the substrate can be reduced compared with that in the case where the film formation is performed at a constant oxygen partial pressure (that is, the above-described average partial pressure of oxygen).

Figure 23A:
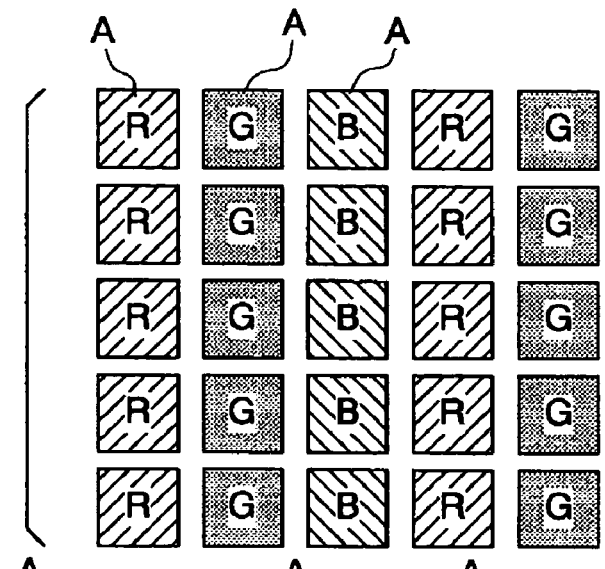
FIGS. 23(A)-23(C) are schematic plan views showing the arrangements of the luminescent layers.
Figure 23B:
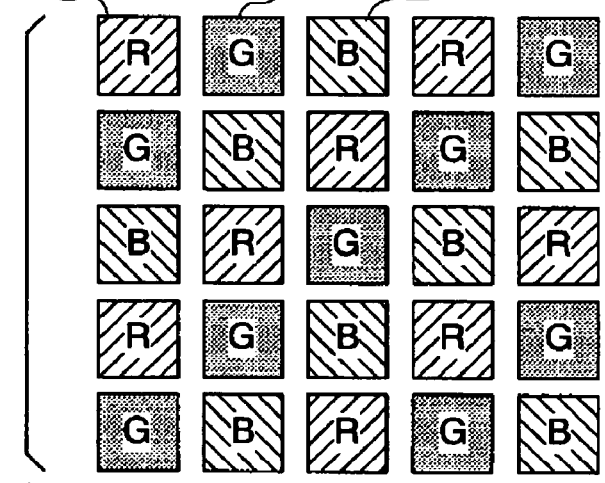
Figure 23C:
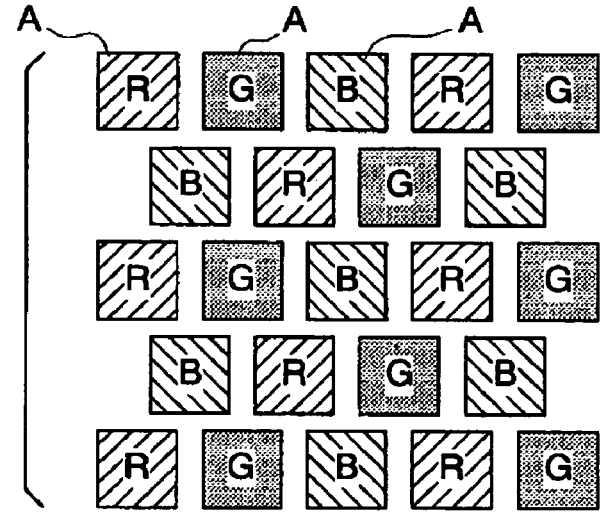

In the above-described exemplary embodiment, the case where the luminescent layers 110b of each of R, G, and B are arranged in the stripe is described. However, the present invention is not limited to this, and various arrangement can be adopted. For example, a mosaic arrangement shown in FIG. 23(B) or a delta arrangement shown in FIG. 23(C) may be adopted instead of the stripe arrangement shown in FIG. 23(A).

In the example shown in the above-described exemplary embodiment, the organic EL material is used for the luminescent layer 110b. However, as a matter of course, the present invention can be applied to a display device in which an inorganic EL material is used for the luminescent layer 110b (that is, an inorganic EL display device).

Furthermore, in the above-described exemplary embodiment, each luminescent portion A is disposed in the region separated by the partition wall 112. However, the partition wall to separate each luminescent portion A is not always necessary. When such a partition wall 112 is not provided, the getter element may be deposited in the region between luminescent portions A adjacent to each other in a plan view.

What is claimed is:

1. An electroluminescent display device, comprising:
    a first electrode;
    a function layer including an organic luminescent layer; and
    a transparent second electrode made of a metal oxide, which are laminated on a substrate in that order,
    a lower portion of the second electrode in a vicinity of an interface between the second electrode and the function layer having an oxygen concentration lower than an average oxygen concentration in the second electrode, and
    the second electrode having an oxygen concentration that increases continuously or stepwise from the interface in a thickness direction of the second electrode.

2. Electronic equipment, comprising:
    the electroluminescent display device according to claim 1.

3. The electroluminescent display device according to claim 1, the lower portion of the second electrode having a substantially zero oxygen concentration.

* * * * *